United States Patent
Baek et al.

(10) Patent No.: US 9,306,070 B2
(45) Date of Patent: Apr. 5, 2016

(54) SEMICONDUCTOR DEVICE AND METHOD OF FABRICATING THE SAME

(71) Applicant: Samsung Electronics Co., Ltd., Suwon-si (KR)

(72) Inventors: Kang-Hyun Baek, Yongin-si (KR); Sung-Hyun Park, Suwon-si (KR); Sang-Hoon Baek, Seoul (KR); Tae-Joong Song, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/465,968

(22) Filed: Aug. 22, 2014

(65) Prior Publication Data
US 2015/0137262 A1 May 21, 2015

(30) Foreign Application Priority Data

Nov. 18, 2013 (KR) .................... 10-2013-0139840

(51) Int. Cl.
| *H01L 29/78* | (2006.01) |
|---|---|
| *H01L 27/11* | (2006.01) |
| *H01L 27/02* | (2006.01) |
| H01L 29/06 | (2006.01) |
| H01L 29/423 | (2006.01) |
| H01L 29/66 | (2006.01) |

(52) U.S. Cl.
CPC .......... *H01L 29/785* (2013.01); *H01L 27/0207* (2013.01); *H01L 27/1104* (2013.01); *H01L 29/0696* (2013.01); *H01L 29/4238* (2013.01); *H01L 29/66795* (2013.01)

(58) Field of Classification Search
None
See application file for complete search history.

(56) References Cited

U.S. PATENT DOCUMENTS

| 6,764,884 | B1 | 7/2004 | Yu et al. | |
|---|---|---|---|---|
| 7,309,626 | B2 * | 12/2007 | Ieong et al. | ................... 438/157 |
| 7,534,669 | B2 | 5/2009 | Anderson et al. | |
| 7,560,785 | B2 | 7/2009 | Yu et al. | |
| 7,638,843 | B2 | 12/2009 | Xiong et al. | |
| 7,662,691 | B2 * | 2/2010 | Chung | .......................... 438/294 |
| 7,763,531 | B2 | 7/2010 | Abadeer et al. | |
| 7,829,951 | B2 | 11/2010 | Song et al. | |
| 7,960,287 | B2 | 6/2011 | Johnson et al. | |
| 8,232,164 | B2 | 7/2012 | Anderson et al. | |
| 8,268,727 | B2 | 9/2012 | Johnson et al. | |
| 8,373,217 | B2 | 2/2013 | Chang | |
| 8,404,592 | B2 | 3/2013 | Luning et al. | |

(Continued)

FOREIGN PATENT DOCUMENTS

JP 2006196617 7/2006

*Primary Examiner* — Michelle Mandala
*Assistant Examiner* — Tyler Drye
(74) *Attorney, Agent, or Firm* — Onello & Mello, LLP

(57) ABSTRACT

A semiconductor device includes: active fins protruding from an active layer and extending in a first direction; a gate structure on the active fins extending in a second direction intersecting the first direction; and a spacer on at least one side of the gate structure, wherein each of the active fins includes a first region and a second region adjacent to the first direction in the first direction, and a width of the first region in the second direction is different from a width of the second region in the second direction.

19 Claims, 31 Drawing Sheets

(56) References Cited

U.S. PATENT DOCUMENTS

| | | |
|---|---|---|
| 2005/0051825 A1* | 3/2005 | Fujiwara et al. .............. 257/308 |
| 2009/0057761 A1* | 3/2009 | Kim et al. .................... 257/344 |
| 2009/0309162 A1* | 12/2009 | Baumgartner et al. ....... 257/368 |
| 2010/0267237 A1 | 10/2010 | Bonser et al. |
| 2011/0195564 A1 | 8/2011 | Liaw et al. |
| 2012/0235247 A1 | 9/2012 | Cai et al. |
| 2013/0056795 A1 | 3/2013 | Wu et al. |
| 2013/0093026 A1 | 4/2013 | Wann et al. |
| 2013/0299834 A1* | 11/2013 | Lee .................... H01L 29/7827 257/66 |
| 2014/0131813 A1* | 5/2014 | Liaw ........................... 257/401 |

* cited by examiner

1200

1300

1400

SEMICONDUCTOR DEVICE AND METHOD OF FABRICATING THE SAME

This U.S. non-provisional application claims priority under 35 U.S.C. §119 to Korean Patent Application No. 10-2013-0139840 filed on Nov. 18, 2013 in the Korean Intellectual Property Office, the contents of which are herein incorporated by reference in their entirety.

BACKGROUND

1. Field of the Invention

The present inventive concepts relate to a semiconductor device and a method of fabricating the same.

2. Description of the Related Art

Semiconductor devices are being developed to operate at high speeds and with a low voltage. In addition, processes of fabricating a semiconductor devices are being developed to increase integration density.

Increased integration density can cause a short-channel effect in a field effect transistor which is a type of semiconductor device. To overcome this problem, a fin field effect transistor (FinFET) which includes a channel having a three-dimensional spatial structure is being developed.

SUMMARY

The present inventive concepts provide a semiconductor device in which various characteristics, for example, threshold voltage (Vth), leakage current, or the like, of a transistor may be controlled using a width of an active fin formed under the transistor.

The present inventive concepts also provide a method of fabricating a semiconductor device, the method being employed to easily form transistors having various characteristics which may be controlled using a width of an active fin formed under the transistors.

However, the example embodiments of the present inventive concepts are not restricted to those set forth herein. The above and other aspects of the present inventive concepts will become more apparent to one of ordinary skill in the art to which the present inventive concepts pertains by referencing the detailed description of the present inventive concepts given below.

According to one aspect of the present inventive concepts, there is provided a semiconductor device including: active fins protruding from an active layer and extending in a first direction; a gate structure on the active fins to extend in a second direction intersecting the first direction; and a spacer which is disposed on at least one side of the gate structure, wherein each of the active fins includes a first region and a second region adjacent to the first region in the first direction, and a width of the first region in the second direction is different from a width of the second region in the second direction.

In some embodiments, the first region is under the gate structure, and the second region is under the spacer.

In some embodiments, part of the first region is under the spacer.

In some embodiments, the width of the first region in the second direction is smaller than the width of the second region in the second direction.

In some embodiments, the active fins comprise first through third active fins which are arranged sequentially in the second direction to be separated from each other, wherein a first gap between the first region of the first active fin and the first region of the second active fin is different from a second gap between the first region of the second active fin and the first region of the third active fin.

In some embodiments, the active fins comprise first through third active fins which are arranged sequentially in the second direction to be separated from each other, wherein a first gap between the first region of the first active fin and the first region of the second active fin is equal to a second gap between the first region of the second active fin and the first region of the third active fin.

In some embodiments, the active fins comprise a first active fin and a second active fin which are separated from each other in the first direction, wherein the first active fin is in the first region, and the second active fin is in the second region.

In some embodiments, the semiconductor device further includes a self-aligned contact which electrically connects the first active fin and the second active fin.

In some embodiments, a width of the first active fin in the second direction is greater than a width of the second active fin in the second direction, and the first active fin comprises third through fifth active fins which are arranged sequentially in the second direction to be separated from each other, wherein a gap between the third active fin and the fourth active fin is equal to a gap between the fourth active fin and the fifth active fin.

In some embodiments, a width of the first active fin in the second direction is greater than a width of the second active fin in the second direction, and the first active fin comprises third through fifth active fins which are arranged sequentially in the second direction to be separated from each other, wherein a gap between the third active fin and the fourth active fin is different from a gap between the fourth active fin and the fifth active fin.

In some embodiments, a side of the first active fin is aligned with a side of the second active fin in the first direction.

According to another aspect of the present inventive concepts, there is provided a semiconductor device including: a first transistor; and a second transistor, wherein the first transistor includes a first active fin which extends in a first direction, and the second transistor includes a second active fin which is aligned with the first active fin in the first direction, wherein a width of the first active fin in a second direction intersecting the first direction is different from a width of the second active fin in the second direction.

In some embodiments, the semiconductor device includes a static random access memory (SRAM), wherein the first transistor comprises a pull-up transistor, and the second transistor comprises a pull-down transistor.

In some embodiments, wherein the width of the first active fin in the second direction is greater than the width of the second active fin in the second direction, and the first active fin comprises third through fifth active fins which are arranged sequentially in the second direction to be separated from each other, wherein a gap between the third active fin and the fourth active fin is equal to a gap between the fourth active fin and the fifth active fin.

In some embodiments, a side of the first active fin is aligned with a side of the second active fin in the first direction.

According to another aspect of the present inventive concepts, there is provided a semiconductor device including a plurality of active fins extending in a first direction and a gate structure extending in a second direction on a portion of each of the plurality of active fins. Each of the plurality of active fins includes a first region and a second region. The first region of each of the plurality of active fins comprises a first width in the second direction and the second region of each of the plurality of active fins comprises a second width in the second direction. The first width is smaller than the second width.

In some embodiments, a spacer on at least one side of the gate structure.

In some embodiments, part of the first region is under the gate structure and part of the first region is under the spacer, and the second region is under the spacer.

In some embodiments, the plurality of active fins comprise first through third active fins which are arranged sequentially in the second direction to be separated from each other, wherein a first gap between the first region of the first active fin and the first region of the second active fin is different from a second gap between the first region of the second active fin and the first region of the third active fin.

In some embodiments, plurality of active fins comprise first through third active fins which are arranged sequentially in the second direction to be separated from each other, wherein a first gap between the first region of the first active fin and the first region of the second active fin is equal to a second gap between the first region of the second active fin and the first region of the third active fin.

According to another aspect of the present inventive concepts, there is provided a method of fabricating a semiconductor device. The method includes: forming a dummy structure, which extends in a first direction, on an active layer; forming dummy spacers, which extend in the first direction, on both sides of the dummy structure; changing a width of a region of each of the dummy spacers in a second direction intersecting the first direction; exposing a top surface of the active layer by removing the dummy structure; and forming active fins by etching the active layer using the dummy spacers as a mask.

BRIEF DESCRIPTION OF THE DRAWINGS

The foregoing and other features and advantages of the inventive concepts will be apparent from the more particular description of embodiments of the inventive concepts, as illustrated in the accompanying drawings in which like reference characters refer to the same parts throughout the different views. The drawings are not necessarily to scale, emphasis instead being placed upon illustrating the principles of the inventive concepts.

DETAILED DESCRIPTION OF THE EMBODIMENTS

Figure 1A:
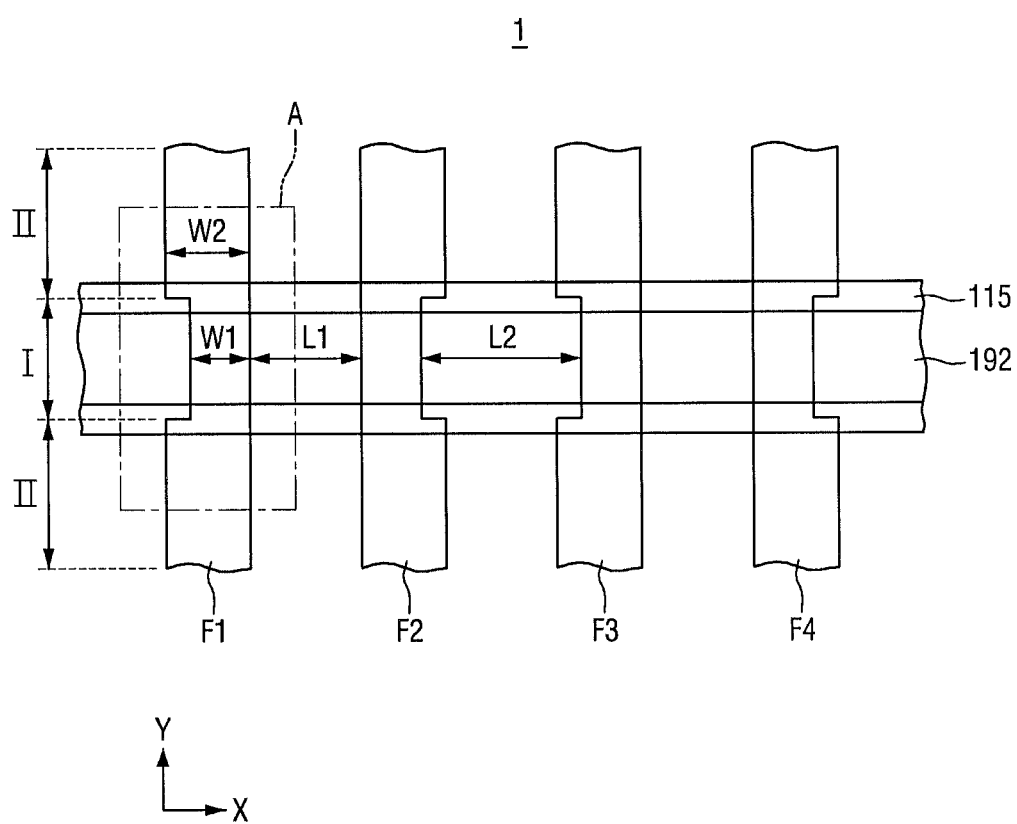
FIG. 1A is a partial layout diagram of a semiconductor device according to an example embodiment of the present inventive concepts.

Various example embodiments will be described more fully hereinafter with reference to the accompanying drawings, in which some example embodiments are shown. The present inventive concepts may, however, be embodied in many different forms and should not be construed as limited to the example embodiments set forth herein.

It will be understood that when an element or layer is referred to as being "on," "connected to" or "coupled to" another element or layer, it can be directly on, connected or coupled to the other element or layer or intervening elements or layers may be present. In contrast, when an element or layer is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

Spatially relative terms, such as "below," "beneath," "lower," "above," "upper," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" or "beneath" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements and/or components, but do not preclude the presence or addition of one or more other features, integers, steps, operations, elements and/or components.

It will be understood that, although the terms first, second, third, or the like, may be used herein to describe various elements, components, regions, layers, and/or sections, these elements, components, regions, layers, and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present inventive concepts.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

A semiconductor device 1 according to an example embodiment of the present inventive concepts will now be described with reference to FIGS. 1A through 4.

Figure 1B:
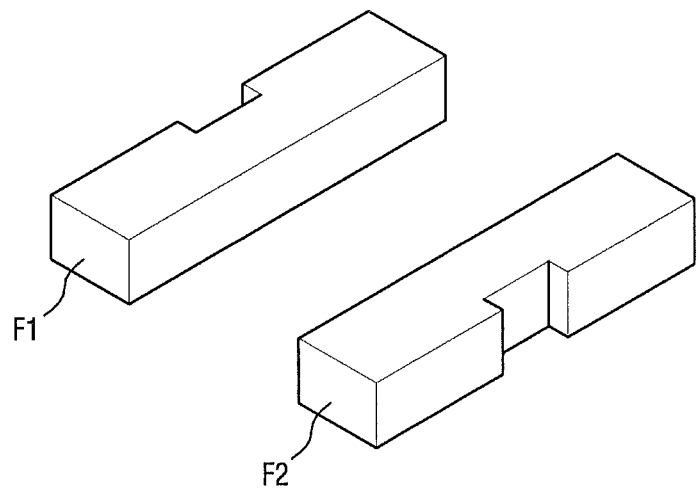
FIG. 1B is a partial perspective view of active fins illustrated in FIG. 1A according to an example embodiment of the present inventive concepts.
Figure 2:
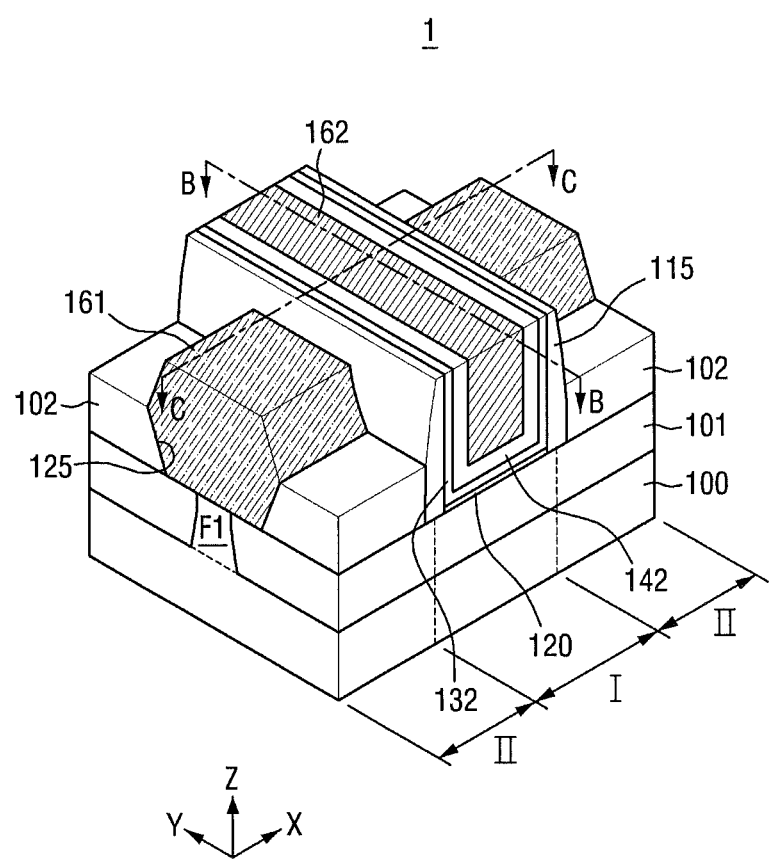
FIG. 2 is a perspective view of a region A of FIG. 1A according to an example embodiment of the present inventive concepts.
Figure 3:
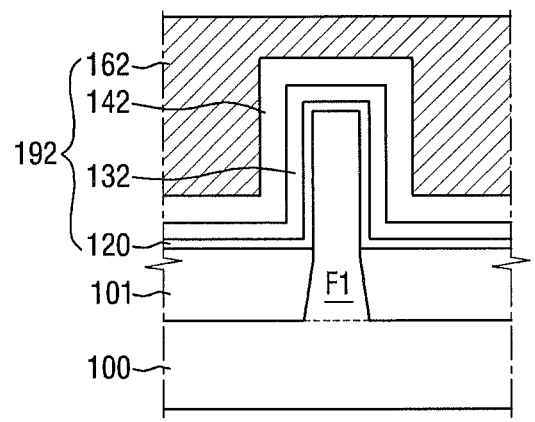
FIG. 3 is a cross-sectional view taken along line B-B of FIG. 2 according to an example embodiment of the present inventive concepts.
Figure 4:
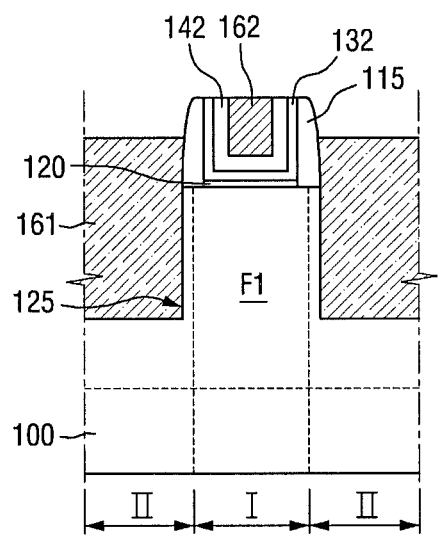
FIG. 4 is a cross-sectional view taken along line C-C of FIG. 2 according to an example embodiment of the present inventive concepts.

FIG. 1A is a partial layout diagram of the semiconductor device 1 according to an example embodiment of the present inventive concepts. FIG. 1B is a partial perspective view of active fins illustrated in FIG. 1A according to an example embodiment of the present inventive concepts. FIG. 2 is a partial perspective view of a region A of FIG. 1A according to an example embodiment of the present inventive concepts. FIG. 3 is a cross-sectional view taken along line B-B of FIG. 2 according to an example embodiment of the present inventive concepts. FIG. 4 is a cross-sectional view taken along line C-C of FIG. 2 according to an example embodiment of the present inventive concepts.

The semiconductor device 1 according to the current example embodiment includes fin field effect transistors (Fin-FETs) and will hereinafter be described as an example. However, the present inventive concepts are not limited to this embodiment. The technical spirit of the present inventive concepts is also applicable to a semiconductor device including three-dimensional semiconductor elements, for example, transistors using nanowires, instead of FinFETs.

Referring to FIGS. 1A through 4, the semiconductor device 1 may include a plurality of active fins F1 through F4, a gate structure 192, and spacers 115.

The active fins F1 through F4 may protrude from an active layer 100 in a third direction Z as illustrated in FIG. 2. In some embodiments of the present inventive concepts, the active fins F1 through F4 may be formed by partially etching the active layer 100. However, the present inventive concepts are not limited thereto.

In some embodiments of the present inventive concepts, the active layer 100 may be a semiconductor substrate. When the active layer 100 is a semiconductor substrate, the semiconductor substrate may be formed of one or more semiconductor materials selected from the group consisting of Si, Ge, SiGe, GaP, GaAs, SiC, SiGeC, InAs, and InP.

In some other embodiments of the present inventive concepts, the active layer 100 may be an epitaxial layer formed of a semiconductor material. Here, the epitaxial layer may be formed on, for example, an insulating substrate. That is, the active layer 100 may be an SOI substrate.

The active layer 100 formed as an SOI substrate may reduce a delay time in the operation process of the semiconductor device 1.

The active fins F1 through F4 may extend in a first direction Y and may be separated from each other in a second direction X.

In the example embodiment of FIGS. 1A through 4, each of the active fins F1 through F4 may include a first region I and a second region II. Here, the second region II may be disposed adjacent to the first region I in the first direction Y.

In the example embodiment of FIGS. 1A through 4, a width W1 of the first region I of the fins F1 through F4 extending in the second direction X may be different from a width W2 of the second region II of the fins F1 through F4 extending in the second direction X. Specifically, the width W1 of the first region I of the fins F1 through F4 extending in the second direction X may be smaller than the width W2 of the second region II of the fins F1 through F4 extending in the second direction X.

In the example embodiment of FIGS. 1A through 4, the first region I may be asymmetrical with respect to a centerline of each of the active fins F1 through F4 which extends in the first direction Y. That is, a distance from the centerline of each of the active fins F1 through F4 to a first side of the first region I in the second direction X may be different from a distance from the centerline to the other side of the first region I opposite the first side.

Figure 22:
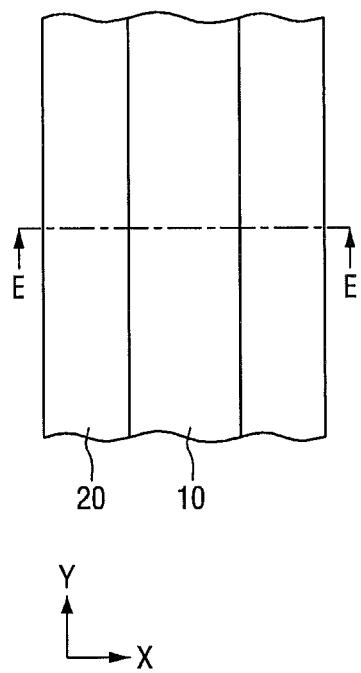
FIGS. 22 through 27 are views illustrating steps of methods of fabricating semiconductor devices according to example embodiments of the present inventive concepts.

In the example embodiment of FIGS. 1A through 4, two of the active fins F1 through F4 may form each group, because two active fins are formed from one dummy gate structure 10, as illustrated in FIG. 22, referred to as a mandrel, as will be described in detail later.

As described above, in the example embodiment of FIGS. 1A through 4, the first region I is asymmetrical with respect to the centerline of each of the active fins F1 through F4, and two of the active fins F1 through F4 form each group. Therefore, a first gap L1 between the first region I of the first active fin F1 and the first region I of the second active fin F2 may be different from a second gap L2 between the first region I of the second active fin F2 and the first region I of the third active fin F3. Specifically, in the example embodiment of FIGS. 1A through 4, the first gap L1 may be smaller than the second gap L2.

A device isolation layer 101 may cover side surfaces of each of the active fins F1 through F4. Specifically, the device isolation layer 101 may cover a lower part of each of the active fins F1 through F4, as illustrated in FIG. 3. In some embodiments of the present inventive concepts, the device isolation layer 101 may be, for example, an insulating layer. More specifically, the device isolation layer 101 may be, but is not limited to, a silicon oxide ($SiO_2$) layer, a silicon nitride (SiN) layer, or a silicon oxynitride (SiON) layer.

As illustrated in FIGS. 2 and 3, a cross-section of each of the active fins F1 through F4 may be tapered, that is, may become wider from top to bottom. However, the cross-sectional shape of each of the active fins F1 through F4 is not limited to the tapered shape. In some embodiments, each of the active fins F1 through F4 may have a quadrangular cross-sectional shape. In some other embodiments, each of the active fins F1 through F4 may have a chamfered cross-sectional shape. That is, corners of each of the active fins F1 through F4 may be curved.

The gate structure 192 may be formed on the active fins F1 through F4 to extend in the second direction X. The spacers 115 may be disposed on both sides of the gate structure 192. The spacers 115 may be disposed on the active fins F1 through F4 to extend in the second direction X.

In some embodiments of the present inventive concepts, the first region I of each of the active fins F1 through F4 may be disposed under the gate structure 192, and the second region II of each of the active fins F1 through F4 may be disposed under each of the spacers 115. In some embodiments of the present inventive concepts, part of the first region I of each of the active fins F1 through F4 may be disposed under the spacers 115. That is, a boundary between the first region I and the second region II of each of the active fins F1 through F4 may be formed under each of the spacers 115.

In the example embodiment of FIGS. 1A through 4, a transistor may be formed on the first region I of each of the active fins F1 through F4 and part of the second region II of each of the active fins F1 through F4. The transistor may include the gate structure 192, the spacers 115, and source/drain regions 161.

The gate structure 192 may include an interface layer 120, a gate insulating layer 132, a work function control layer 142, and a gate electrode 162 sequentially formed on the active fins F1 through F4.

The interface layer 120 may be disposed on the device isolation layer 101 and the active fins F1 through F4 to extend in the second direction X. The interface layer 120 may be formed between spacers 115 at a bottom portion thereof. The interface layer 120 may include a low-k material layer having a dielectric constant (k), for example, of 9 or less, for example, a silicon oxide layer (having a dielectric constant of approximately 4) or a silicon oxynitride layer (having a dielectric constant of approximately 4 to 8 depending on the content of oxygen atoms and nitrogen atoms). Alternatively, the interface layer 120 may be formed of silicate or a combination of the above example layers.

The gate insulating layer 132 may be disposed on the interface layer 120. Specifically, the gate insulating layer 132 may extend in the second direction X and partially cover an upper part of each of the active fins F1 through F4. As illustrated in FIG. 4, the gate insulating layer 132 may also extend upward, that is, in the third direction Z, along sidewalls of the spacers 115 disposed on both sides of the gate electrode 162. The gate insulating layer 132 extends along vertical sidewalls of the gate electrode 162 below gate electrode 162 and along an upper portion of active fins F1 through F4. The gate insulating layer 132 is formed between the interface layer 120 and the work function control layer 142. In the example embodiment of FIGS. 1A through 4, the gate insulating layer 132 is shaped as described above because it is formed by a replacement process (or a gate last process). However, the present inventive concepts are not limited thereto, and the shape of the gate insulating layer 132 may vary as desired.

In some other embodiments of the present inventive concepts, the gate insulating layer 132 may be formed by a gate first process. Thus, the gate insulating layer 132 may not extend upward along the sidewalls of the spacers 115, unlike in FIG. 4. That is, the gate insulating layer 132 may extend between spacer 115 at a bottom portion thereof.

The gate insulting layer 132 may be formed of a high-k material. In some embodiments of the present invention, the gate insulating layer 132 may be formed of, but not limited to $HfO_2$, $Al_2O_3$, $ZrO_2$, $TaO_2$, or the like.

The work function control layer 142 may be disposed on the gate insulating layer 132. The work function control layer 142 may extend in the second direction X and partially cover the upper part of each of the active fins F1 through F4. Like the gate insulating layer 132, the work function control layer 142 may extend upward along the sidewalls of the spacers 115 that is, in the third direction Z. The gate insulating layer 132 may be formed between the spacers 115 and the work function control layer 142. The work function control layer 142 may extend along vertical side walls of the gate electrode 162, below gate electrode 162 and along an upper portion of the active fins F1 through F4. In the example embodiment of FIGS. 1A through 4, the work function control layer 142 is shaped as described above because it is formed by a replacement process (or a gate last process). However, the present inventive concepts are not limited thereto, and the shape of the work function control layer 142 may vary as desired.

The work function control layer 142 may be a layer used to control the work function of a transistor. The work function control layer 142 may be at least one of an n-type work function control layer and a p-type work function control layer. When the work function control layer 142 according to the example embodiment of FIGS. 1A through 4 is an n-type work function control layer. The work function control layer 142 may be, but is not limited to, TiAl, TiAlN, TaC, TaAlN, TiC, or HfSi.

When the work function control layer 142 according to the example embodiment of FIGS. 1A through 4 is a p-type work function control layer, it may include, for example, metal nitride. Specifically, in some embodiments of the present inventive concepts, the work function control layer 142 may include at least one of TiN and TaN. More specifically, the work function control layer 142 may be, but is not limited to, a single layer formed of TiN or a double layer composed of a TiN lower layer and a TaN upper layer.

The gate electrode 162 may be disposed on the work function control layer 142. The gate electrode 162 may extend in the second direction X and partially cover the upper part of each of the active fins F1 through F4. The gate electrode may be disposed between spacers 115.

The gate electrode 162 may include a highly conductive material. In some embodiments of the present inventive concepts, the gate electrode 162 may include a metal, for example. The metal may include, but is not limited to, Al and W.

Recesses 125 may be formed in each of the active fins F1 through F4 on both sides of the gate structure 192. Each of the recesses 125 may have sloping sidewalls. Thus, the recesses 125 may become wider as the distance from the active layer 100 increases. That is, as the recesses 125 extend in the third direction Z, the recesses become wider. As illustrated in FIG. 2, the recesses 125 may be wider than the active fins F1 through F4.

The source/drain regions 161 may be formed in the recesses 125, respectively. In some embodiments of the present inventive concepts, the source/drain regions 161 may be elevated source/drain regions. That is, top surfaces of the source/drain regions 161 may be higher than top surfaces of the active fins F1 through F4, as illustrated in FIGS. 2 and 4. In addition, the source/drain regions 161 may be insulated from the gate structure 192 by the spacers 115.

In an embodiment having a p-type transistor, the source/drain regions 161 may include a compressive stress material. The compressive stress material may be a material, for example, SiGe, having a greater lattice constant than Si. The compressive stress material may improve the mobility of carriers in a channel region by applying compressive stress to each of the active fins F1 through F4.

In an embodiment having an n-type transistor, the source/drain regions 161 may include the same material as the active layer 100 or a tensile stress material. For example, when the active layer 100 includes Si, the source/drain regions 161 may include Si or a material, for example, SiC, having a smaller lattice constant than Si.

In the example embodiment of FIGS. 1A through 4, the recesses 125 are formed in each of the active fins F1 through F4, and the source/drain regions 161 are formed in the recesses 125. However, the present inventive concepts are not limited thereto. In some embodiments of the present inventive concepts, the source/drain regions 161 may be formed in each of the active fins F1 through F4 by injecting impurities directly into each of the active fins F1 through F4.

Although only part of an interlayer insulating film 102 is illustrated in FIG. 2, the interlayer insulating film 102 may cover the source/drain regions 161 and the gate structure 192.

Transistors provided in the semiconductor device 1 according to the example embodiment of FIGS. 1A through 4 may have various threshold voltages (Vt) according to the widths W1 and W2 of the active fins F1 through F4 in the second direction X. For example, if the gate structure 192 and the spacers 115 extending in the second direction X in FIG. 1A are placed on the second regions II of the active fins F1 through F4, similar to FIG. 6, transistors formed on the second regions II of the active fins F1 through F4 may have different effective channel widths from transistors formed on the first regions I of the active fins F1 through F4 due to the first region I having the width W1 in the second direction which is different than the width W2 in the second direction of the second region II. Therefore, threshold voltages of the transistors formed on the second regions II of the active fins F1 through F4 may be different from threshold voltages of the transistors formed on the first regions I of the active fins F1 through F4. In addition, leakage currents of the transistors formed on the second regions II of the active fins F1 through F4 may be different from leakage currents of the transistors formed on the first regions I of the active fins F1 through F4.

That is, in the semiconductor device 1 according to the example embodiment of FIGS. 1A through 4, since each of the active fins F1 through F4 has different widths W1 and W2 in the second direction X, a plurality of transistors having various characteristics can be provided.

A semiconductor device 2 according to an example embodiment of the present inventive concepts will now be described with reference to FIG. 5.

Figure 5:
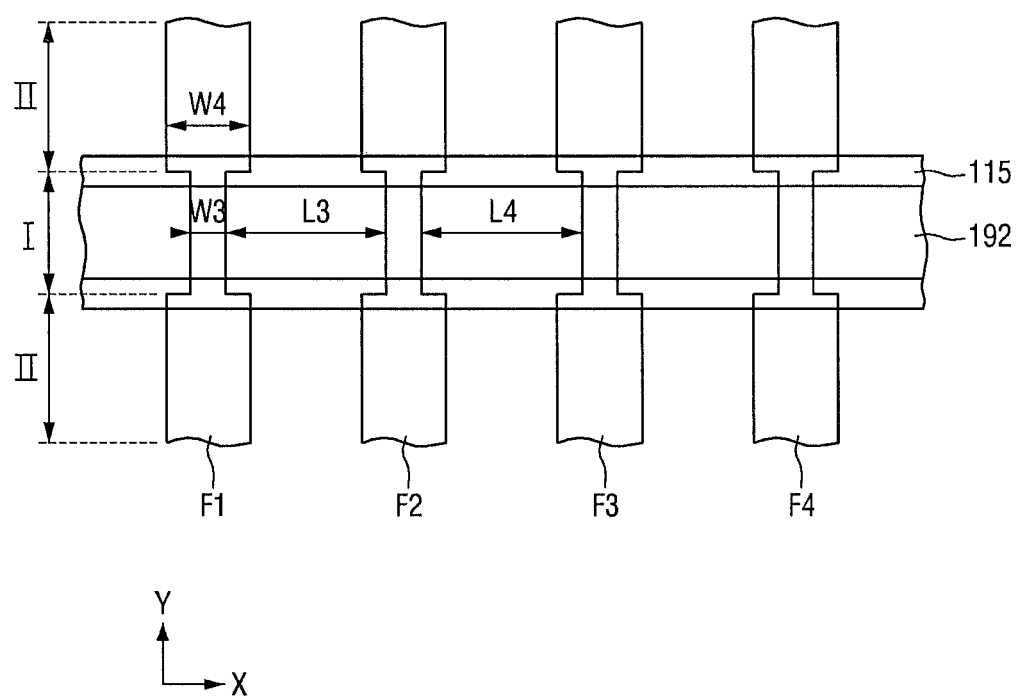
FIG. 5 is a partial layout diagram of a semiconductor device according to an example embodiment of the present inventive concepts.

FIG. 5 is a partial layout diagram of the semiconductor device 2 according to an example embodiment of the present inventive concepts. For simplicity, a description of elements already described in the previous example embodiment will be omitted, and the example embodiment will hereinafter be described, focusing mainly on differences from the previous example embodiment.

Referring to FIG. 5, in the semiconductor device 2 according to the example embodiment of FIG. 5, a first region I of each of a plurality of active fins F1 through F4 may have a different shape from that of each of the active fins F1 through F4 in the previous example embodiment of FIGS. 1A through 4. That is, in the previous example embodiment of FIGS. 1A through 4, the first region I of FIG. 1A of each of the active fins F1 through F4 of FIG. 1A is asymmetrical with respect to the centerline extending in the first direction Y of each of the active fins F1 through F4. In the example embodiment of FIG. 5, however, the first region I of each of the active fins F1 through F4 may be symmetrical with respect to a centerline extending in the first direction Y of each of the active fins F1 through F4. That is, a distance from the centerline of each of the active fins F1 through F4 to a first side of the first region I of the active fins F1 through F4 may be equal to a distance from the centerline to the other side of the first region I of the active fins F1 through F4 opposite the first side.

Since the first region I of each the active fins F1 through F4 is symmetrical with respect to the centerline of each of the active fins F1 through F4, a third gap L3 between the first region I of the first active fin F1 and the first region I of the second active fin F2 may be equal to a fourth gap L4 between the first region I of the second active fin F2 and the first region I of the third active fin F3. If equal gaps are maintained between the active fins F1 through F4, a plurality of transistors having the same characteristics can be formed using one gate structure 192.

In the example embodiment of FIG. 5, a width W3 of the first region I of each of the active fins F1 through F4 in a second direction X may be different from a width W4 of a second region II of each of the active fins F1 through F4 in the second direction X. Specifically, the width W3 of the first region I of each of the active fins F1 through F4 in the second direction X may be smaller than the width W4 of the second region II of each of the active fins F1 through F4 in the second direction X. Accordingly, the example embodiment of FIG. 5 may also provide transistors having various characteristics according to the width W3 or W4 of each of the active fins F1 through F4 in the second direction X, similar to FIG. 6.

A semiconductor device 3 according to an example embodiment of the present inventive concepts will now be described with reference to FIGS. 6 and 7.

Figure 6:
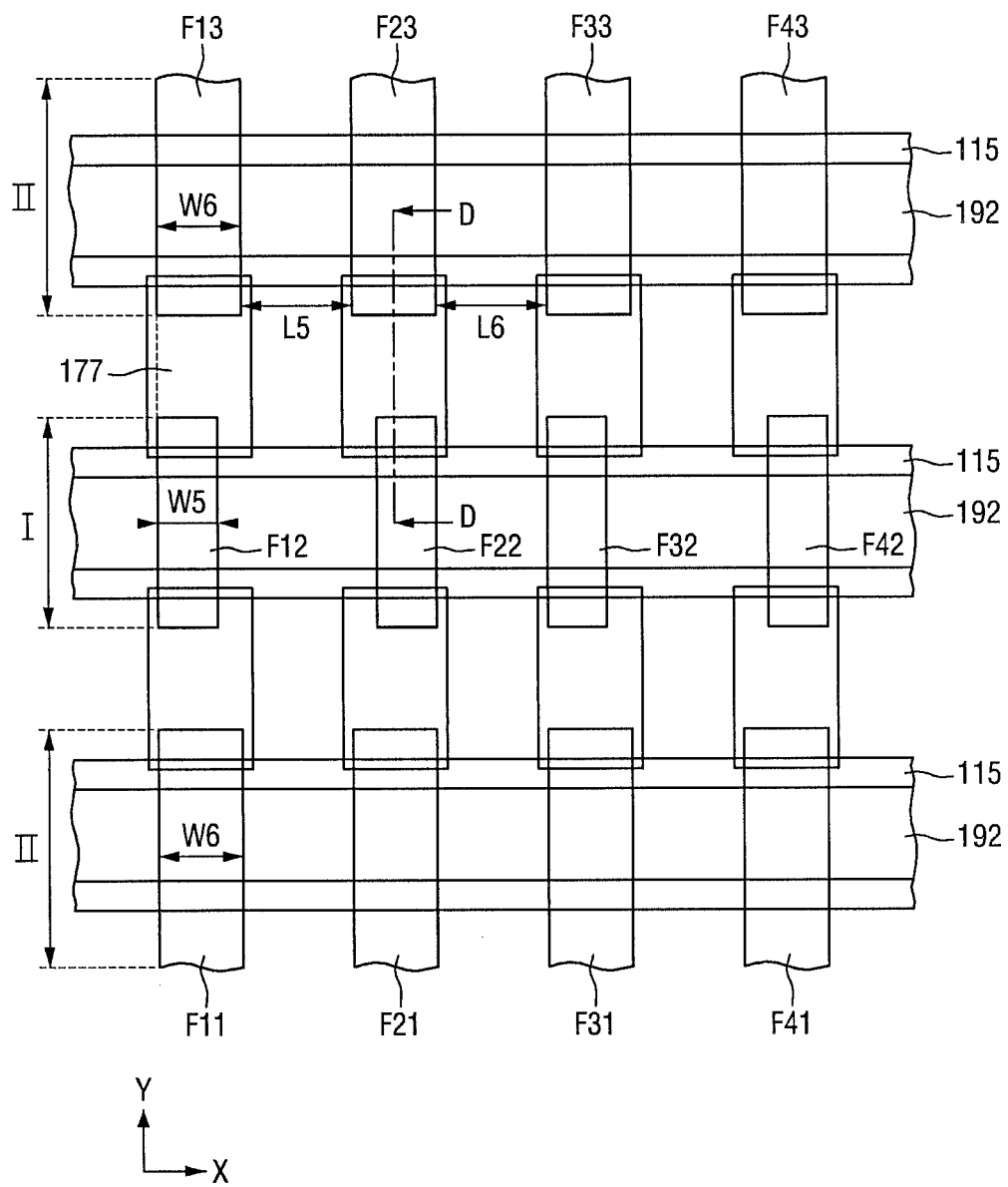
FIG. 6 is a partial layout diagram of a semiconductor device according to an example embodiment of the present inventive concepts.
Figure 7:
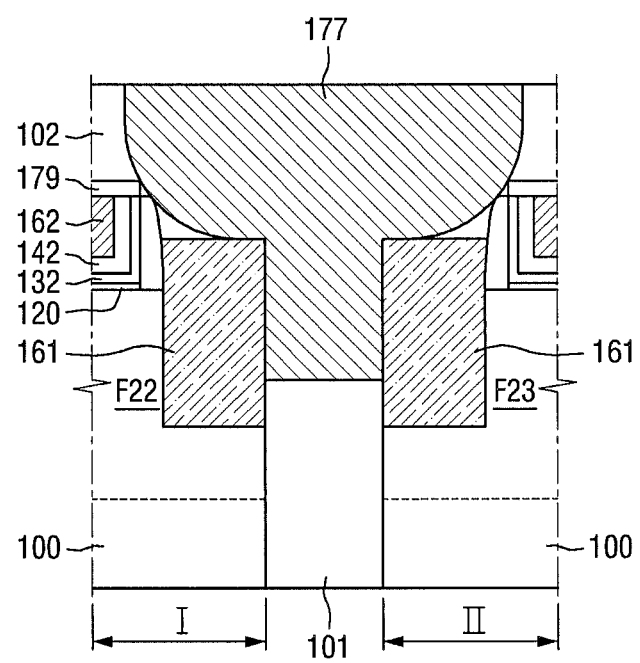
FIG. 7 is a cross-sectional view taken along line D-D of FIG. 6 according to an example embodiment of the present inventive concepts.

FIG. 6 is a partial layout diagram of the semiconductor device 3 according to an example embodiment of the present inventive concepts. FIG. 7 is a cross-sectional view taken along line D-D of FIG. 6 according to an example embodiment of the present inventive concepts. For simplicity, a description of elements already described in the previous example embodiments will be omitted, and the example embodiment of FIGS. 6 and 7 will hereinafter be described, focusing mainly on differences from the previous example embodiments.

Referring to FIG. 6, in the semiconductor device 3 according to the example embodiment of FIG. 6, a plurality of active fins F11 through F13, F21 through F23, F31 through F33 and F41 through F43 may be separated from each other in the first direction Y and the second direction X. That is, the first active fin F1 of FIGS. 1A and 5 of the previous example embodiments may include the eleventh through thirteenth active fins F11 through F13 which are separated from each other in the first direction Y, the second active fin F2 of FIGS. 1A and 5 may include the twenty first through twenty third active fins F21 through F23 which are separated from each other in the first direction Y, the third active fin F3 of FIGS. 1A and 5 may include the thirty first through thirty third active fins F31 through F33 which are separated from each other in the first direction Y, and the fourth active fin F4 of FIGS. 1A and 5 may include the forty first through forty third active fins F41 through F43 which are separated from each other in the first direction Y. Each of group of the plurality of active fins F11 through F13, F21 through F23, F31 through F33 and F41 through F43 are separated from each other in the second direction X, respectively.

In the example embodiment of FIG. 6, a self-aligned contact 177 may be formed between every two adjacent ones of the active fins F11 through F13, F21 through F23, F31 through F33 and F41 through F43, which are separated from each other in the first direction Y, so as to electrically connect the active fins F11 through F13, F21 through F23, F31 through F33 and F41 through F43, respectively. As illustrated in FIG. 7, the self-aligned contact 177 may be formed using a capping layer 179 formed on each gate electrode 162. However, the present inventive concepts are not limited thereto, and the self-aligned contact 177 may be omitted when necessary.

In the example embodiment of FIG. 6, in a second direction X, a width W5 of each of the active fins F12, F22, F32 and F42 located in a first region I may be different from a width W6 of each of the active fins F11, F21, F31 and F41 and F13, F23, F33 and F43 located in the second region II. Specifically, in the second direction X, the width W5 of each of the active fins F12, F22, F32 and F42 located in the first region I may be smaller than the width W6 of each of the active fins F11, F21, F31 and F41 and F13, F23, F33 and F43 located in the second region II. Accordingly, in the example embodiment of FIG. 6, transistors formed on the active fins F12, F22, F32 and F42 located in the first region I may have different characteristics from transistors formed on the active fins F11, F21, F31 and F41 and F13, F23, F33 and F43 located in the second region II.

In the example embodiment of FIG. 6, in the first direction Y, respective sides of the active fins F12, F22, F32 and F42 located in the first region I may be aligned with respective sides of the active fins F11, F21, F31 and F41 and F13, F23, F33 and F43 located in the second region II. However, in the first direction Y, the other respective sides of the active fins F12, F22, F32 and F42 located in the first region I may not be aligned with the other respective sides of the active fins F11, F21, F31 and F41 and F13, F23, F33 and F43 located in the second region II.

A fifth gap L5 between the thirteenth active fin F13 and the twenty third active fin F23 located in the second region II may be equal to a sixth gap L6 between the twenty third active fin F23 and the thirty third active fin F33 located in the second region II. Therefore, a plurality of transistors having the same characteristics can be formed using one gate structure 192.

A semiconductor device 4 according to an example embodiment of the present inventive concepts will now be described with reference to FIG. 8.

Figure 8:
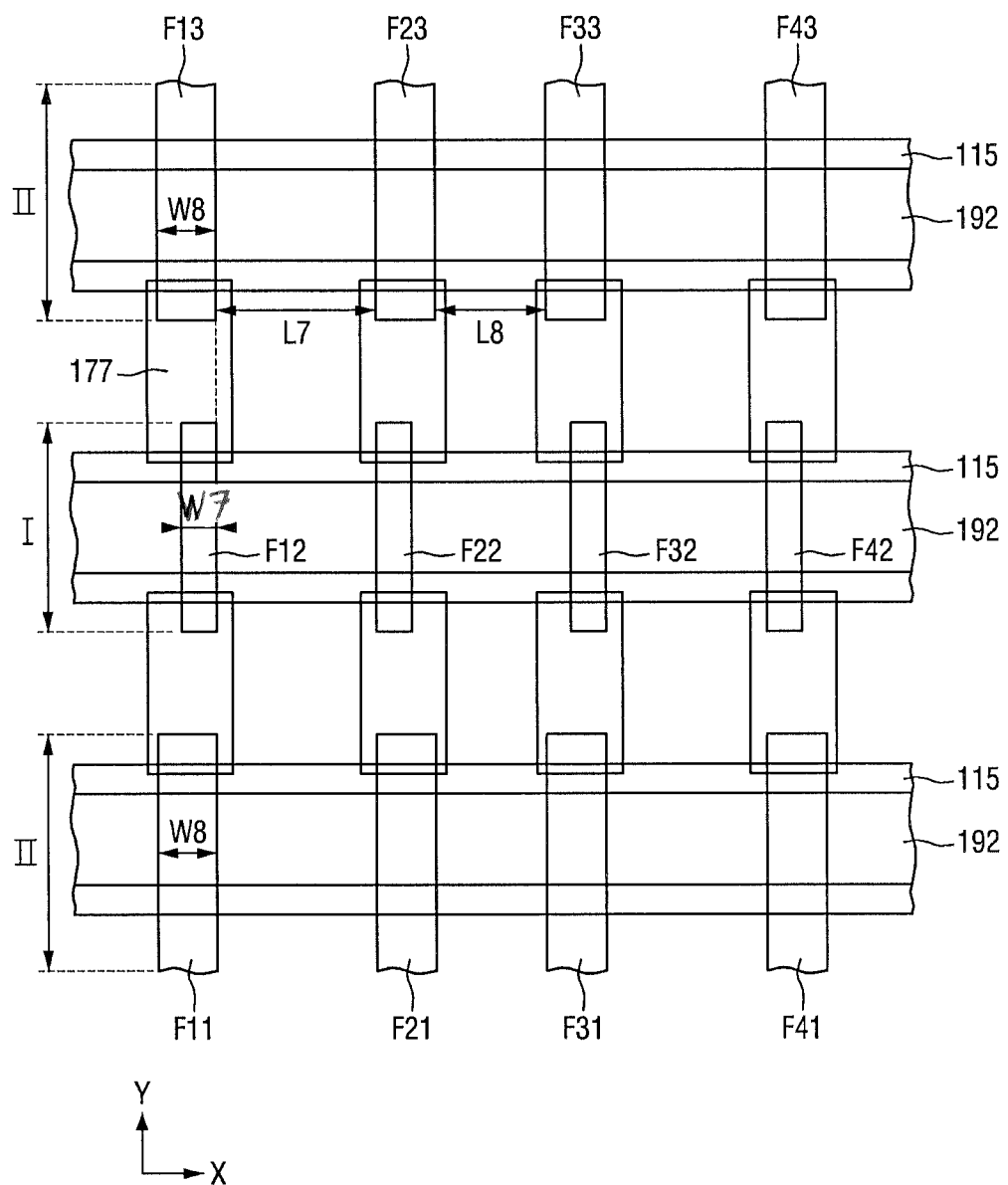
FIG. 8 is a partial layout diagram of a semiconductor device according to an example embodiment of the present inventive concepts.

FIG. 8 is a partial layout diagram of the semiconductor device 4 according to an example embodiment of the present inventive concepts. For simplicity, a description of elements already described in the previous example embodiments will be omitted, and the example embodiment of FIG. 8 will hereinafter be described, focusing mainly on differences from the previous example embodiments.

Referring to FIG. 8, in the semiconductor device 4 according to the example embodiment of FIG. 8, a plurality of active fins F11, F21, F31 and F41 and F13, F23, F33 and F43 located in a second region II may be asymmetrical with respect to respective centerlines extending in the first direction Y of a plurality of active fins F12, F22, F32 and 42 located in a first region I, similar to FIG. 1A.

That is, in a first direction Y, respective first sides of the active fins F12, F22, F32 and F42 located in the first region I may be aligned with respective first sides of the active fins F11, F21, F31 and F41 and F13, F23, F33 and F43 located in the second region II. However, in the first direction Y, the other respective sides of the active fins F12, F22, F32 and F42 opposite the first sides of the active fins F12, F22, F32 and F42 located in the first region I may not be aligned with the other respective sides opposite the first sides of the active fins F11, F21, F31 and F41 and F13, F23, F33 and F43 located in the second region II.

In the example embodiment of FIG. 8, two of the active fins F11, F21, F31 and F41, F12, F22, F32 and F42 and F13, F23, F33 and F43 may form each group. This may be because a pair of active fins are formed from one dummy structure 10, as described in connection with FIG. 22.

In the example embodiment of FIG. 8, in a second direction X, a width W7 of each of the active fins F12, F22, F32 and F42 located in a first region I may be different from a width W8 of each of the active fins F11, F21, F31 and F41 and F13, F23, F33 and F43 located in the second region II. Specifically, in the second direction X, the width W7 of each of the active fins F12, F22, F32 and F42 located in the first region I may be smaller than the width W8 of each of the active fins F11, F21, F31 and F41 and F13, F23, F33 and F43 located in the second region II.

Since the active fins F11, F21, F31 and F41, F12, F22, F32 and F42 and F13, F23, F33 and F43 are shaped as described above, the active fins F11 through F13, F21 through F23 and F31 through F33 may be separated from each other in a second direction X by gaps having different distances in the second direction X. Specifically, a seventh gap L7 between the thirteenth active fin F13 and the twenty-third active fin F23 located in the second region II may be different from an eighth gap L8 between the twenty-third active fin F23 and the thirty-third active fin F33 located in the second region II. More specifically, the width in the second direction X of the seventh gap L7 may be greater than the width in the second direction X of the eighth gap L8 as illustrated in FIG. 8.

A semiconductor device 5 according to an example embodiment of the present inventive concepts will now be described with reference to FIGS. 9 and 10.

Figure 9:
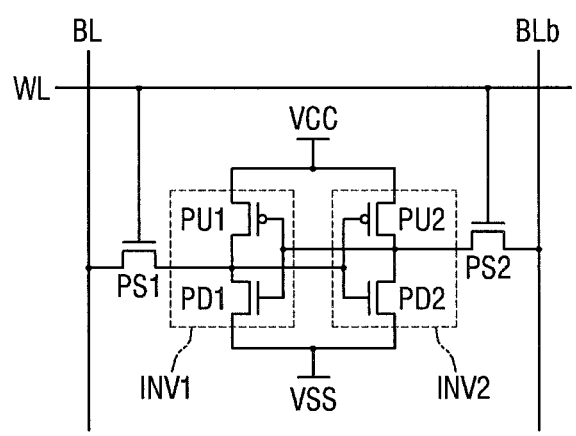
FIG. 9 is a circuit diagram of a semiconductor device according to an example embodiment of the present inventive concepts.

FIG. 9 is a circuit diagram of the semiconductor device 5 according to an example embodiment of the present inventive concepts. FIG. 10 is a layout diagram of the semiconductor device 5 illustrated in FIG. 9 according to an example embodiment of the present inventive concepts. For simplicity, the example embodiment of FIGS. 9 and 10 will hereinafter be described, focusing mainly on differences from the previous example embodiments.

Figure 10:
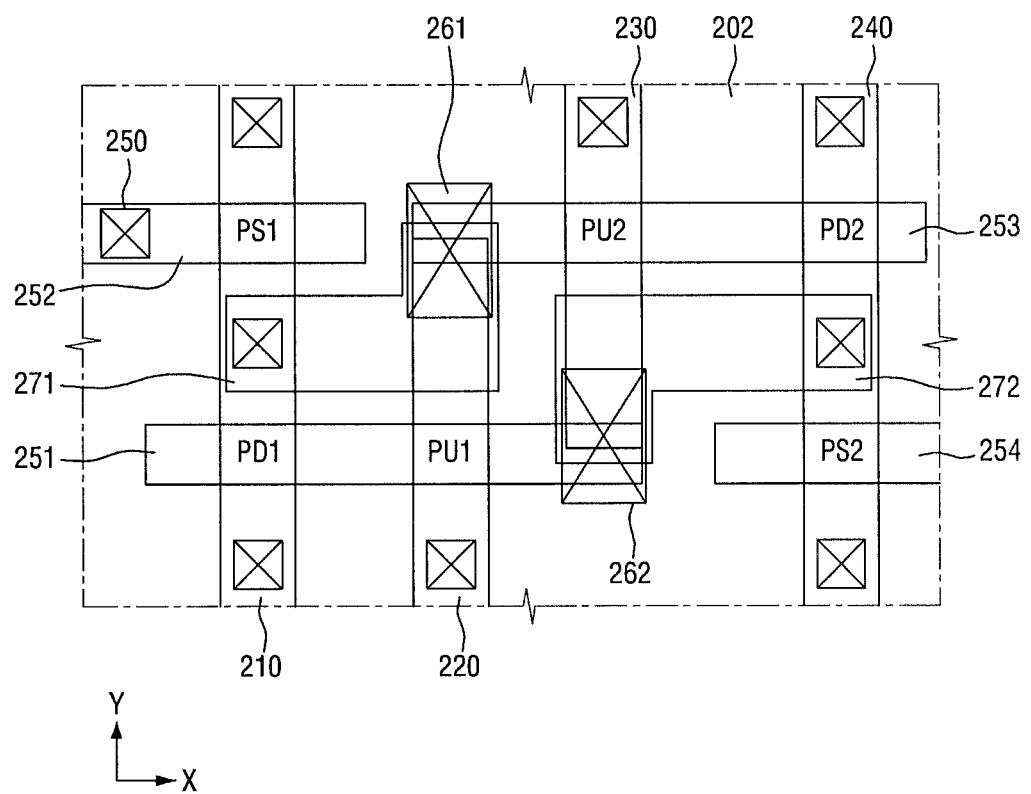
FIG. 10 is a layout diagram of the semiconductor device illustrated in FIG. 9 according to an example embodiment of the present inventive concepts.

Referring to FIGS. 9 and 10, the semiconductor device 5 may include a pair of first and second inverters INV1 and INV2 connected in parallel between a power source node VCC and a ground node VSS and first and second pass transistors PS1 and PS2 respectively connected to output nodes of the first and second inverters INV1 and INV2. The first and second pass transistors PS1 and PS2 may be connected to a bit line BL and a complementary bit line BLb, respectively. Gates of the first and second pass transistors PS1 and PS2 may be connected to a word line WL.

The first inverter INV1 includes a first pull-up transistor PU1 and a first pull-down transistor PD1 connected in series, and the second inverter INV2 includes a second pull-up transistor PU2 and a second pull-down transistor PD2 connected in series. The first and second pull-up transistors PU1 and PU2 may be, for example, p-type field effect transistors (PFETs), and the first and second pull-down transistors PD1 and PD2 may be, for example, n-type field effect transistors (NFETs).

An input node of the first inverter INV1 is connected to the output node of the second inverter INV2, and an input node of the second inverter INV2 is connected to the output node of the first inverter INV1. Thereby, the first and second inverters INV1 and INV2 form a single latch circuit.

Referring again to FIGS. 9 and 10, a first active fin 210, a second active fin 220, a third active fin 230 and a fourth active fin 240 may extend in a direction, for example, a vertical direction, as illustrated in FIG. 10, and are separated from each other in the second direction X. The second active fin 220 and the third active fin 230 may be shorter than the first active fin 210 and the fourth active fin 240.

In addition, a first gate electrode 251, a second gate electrode 252, a third gate electrode 253, and a fourth gate electrode 254 may extend in another direction, for example, the second direction X, as illustrated in FIG. 10, to intersect the first through fourth active fins 210 through 240. Specifically, the first gate electrode 251 may completely intersect the first active fin 210 and the second active fin 220 and partially overlap an end of the third active fin 230. The third gate electrode 253 may completely intersect the fourth active fin 240 and the third active fin 230 and partially overlap an end of the second active fin 220. The second gate electrode 252 and the fourth gate electrode 254 may intersect the first active fin 210 and the fourth active fin 240, respectively.

The first pull-up transistor PU1 may be defined near the intersection of the first gate electrode 251 and the second active fin 220. The first pull-down transistor PD1 may be defined near the intersection of the first gate electrode 251 and the first active fin 210. The first pass transistor PS1 may be defined near the intersection of the second gate electrode 252 and the first active fin 210. The second pull-up transistor PU2 may be defined near the intersection of the third gate electrode 253 and the third active fin 230. The second pull-down transistor PD2 may be defined near the intersection of the third gate electrode 253 and the fourth active fin 240. The second pass transistor PS2 may be defined near the intersection of the fourth gate electrode 254 and the fourth active fin 240.

A source/drain region may be formed on both sides of each of the intersections between the first through fourth gate electrodes 251 through 254 and the first through fourth active fins 210 through 240, respectively. A plurality of contacts 25 may also be formed.

A first shared contact 261 may connect all of the second active fin 220, the third gate line 253, and wiring 271. A second shared contact 262 may connect all of the third active fin 230, the first gate line 251, and wiring 272.

The semiconductor device 5 may be used as, for example, a static random access memory (SRAM). At least one of the transistors PU1 and PU2, PD1 and PD2, and PS1 and PS2 included in the semiconductor device 5 may employ the structures according to the above-described embodiments. For example, the first pass transistor PS1 of FIG. 10 may be formed on the thirteenth active fin F13 of FIG. 6, and the first pull-down transistor PD1 of FIG. 10 may be formed on the twelfth active fin F12 of FIG. 6. In addition, the second pull-down transistor PD2 of FIG. 10 may be formed on the thirteenth active fin F13 of FIG. 8, and the second pass transistor PS2 of FIG. 10 may be formed on the twelfth active fin F12 of FIG. 8.

A semiconductor device 6 according to an example embodiment of the present inventive concepts will now be described with reference to FIGS. 11 through 13.

Figure 11:
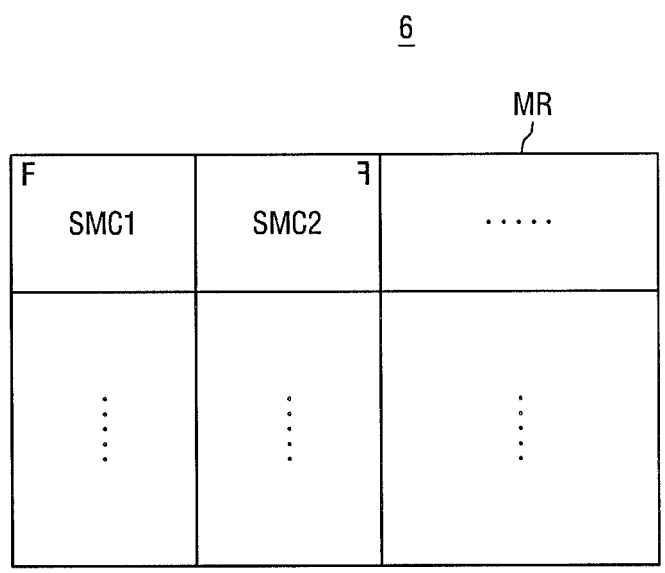
FIG. 11 is a conceptual diagram of a semiconductor device according to an example embodiment of the present inventive concepts.

FIG. 11 is a conceptual diagram of the semiconductor device 6 according to an example embodiment of the present inventive concepts. FIG. 12 is a circuit diagram of a first SRAM cell region SMC1 illustrated in FIG. 11 according to an example embodiment of the present inventive concepts. FIG. 13 is a layout diagram of the first SRAM cell region SMC1 illustrated in FIG. 11 according to an example embodiment of the present inventive concepts. For simplicity, the example embodiment of FIGS. 11 through 13 will hereinafter be described, focusing mainly on differences from the previous example embodiments.

An embodiment in which an SRAM disposed in each memory cell array region MR will hereinafter be described as an example, but the present inventive concepts are not limited to this example embodiment. In addition, an embodiment in which 8T SRAM, each including 8 transistors, are disposed in each memory cell array region MR will hereinafter be described as an example, but the present inventive concepts are not limited to this embodiment.

Referring to FIG. 11, a plurality of SRAM cell regions SMC1, SMC2, ... may be disposed in a memory cell array region MR of the semiconductor device 6. The SRAM cell regions SMC1, SMC2, ... may be arranged in a lattice pattern to form an array.

Figure 12:
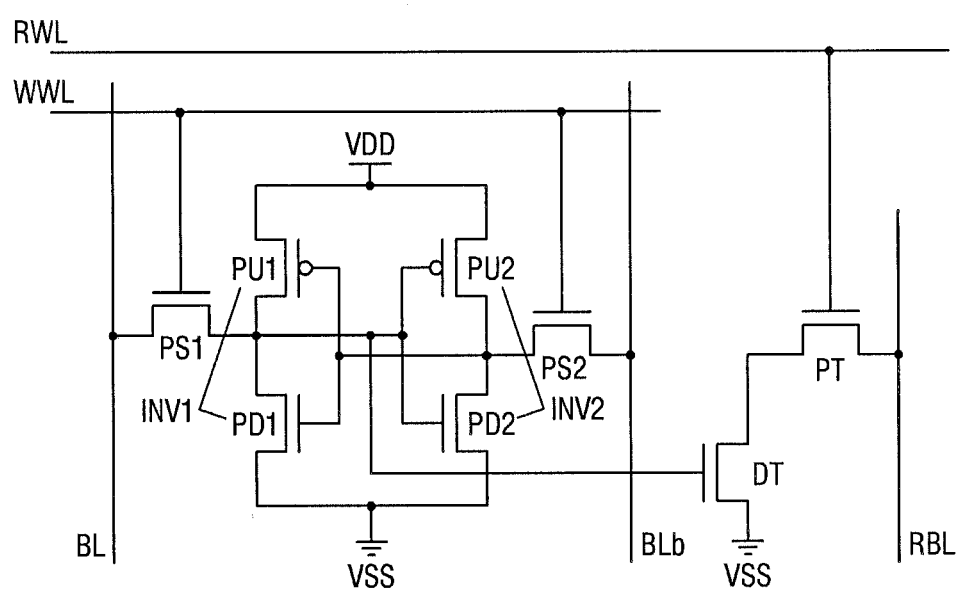
FIG. 12 is a circuit diagram of a first static random access memory (SRAM) cell region illustrated in FIG. 11 according to an example embodiment of the present inventive concepts.

Referring to FIG. 12, each SRAM cell region, for example, the first SRAM cell region SMC1, may include a pair of first and second inverters INV1 and INV2 connected in parallel between a power source node VDD and a ground node VSS, first and second select transistors PS1 and PS2, respectively, connected to output nodes of the first and second inverters INV1 and INV2, a drive transistor DT controlled by an output of the first inverter INV1, and a pass transistor PT connected to an output node of the drive transistor DT. That is, in the example embodiment of FIGS. 11 through 13, each SRAM cell region, for example, the first SRAM cell region SMC1, may include an SRAM device including eight transistors.

The first and second select transistors PS1 and PS2 may be connected to a bit line BL and a complementary bit line BLb, respectively. Gates of the first and second select transistors PS1 and PS2 may be connected to a write word line WWL.

The first inverter INV1 includes a first pull-up transistor PU1 and a first pull-down transistor PD1 connected in series, and the second inverter INV2 includes a second pull-up transistor PU2 and a second pull-down transistor PD2 connected in series. The first and second pull-up transistors PU1 and PU2 may be, for example, PFETs, and the first and second pull-down transistors PD1 and PD2 may be, for example, NFETs.

An input node of the first inverter INV1 may be connected to the output node of the second inverter INV2, and an input node of the second inverter INV2 may be connected to the output node of the first inverter INV1. Thereby, the first and second inverters INV1 and INV2 may form a single latch circuit.

The drive transistor DT and the pass transistor PT may be used to read data stored in the latch circuit formed by the first inverter INV1 and the second inverter INV2. A gate of the drive transistor DT may be connected to the output node of the first inverter INV1, and a gate of the pass transistor PT may be connected to a read word line RWL. An output of the drive transistor DT may be connected to the ground node VSS, and an output of the pass transistor PT may be connected to a read bit line RBL.

The above circuit configuration of the semiconductor device 6 according to the example embodiment allows for data stored in an SRAM device to be accessed through two ports, for example, a double port. First, by selecting the write word line WWL, the bit line BL, and the complementary bit line BLb, it is possible to write data to the latch circuit formed by the first inverter INV1 and the second inverter INV2 or read data stored in the latch circuit formed by the first inverter INV1 and the second inverter INV2. That is, this path may be used as a first port. In addition, by selecting the read word line RWL and the read bit line RBL, it is possible to read data stored in the latch circuit formed by the first inverter INV1 and the second inverter INV2. That is, this path may be used as a second port.

In the SRAM device, an operation of reading data through the second port may be performed independently of an operation of the first port. Therefore, the operation of reading data may not affect data stored in the latch circuit formed by the first inverter INV1 and the second inverter INV2. That is, an operation of reading data stored in the latch circuit and an operation of writing data to the latch circuit may be performed independently from each other.

Figure 13:
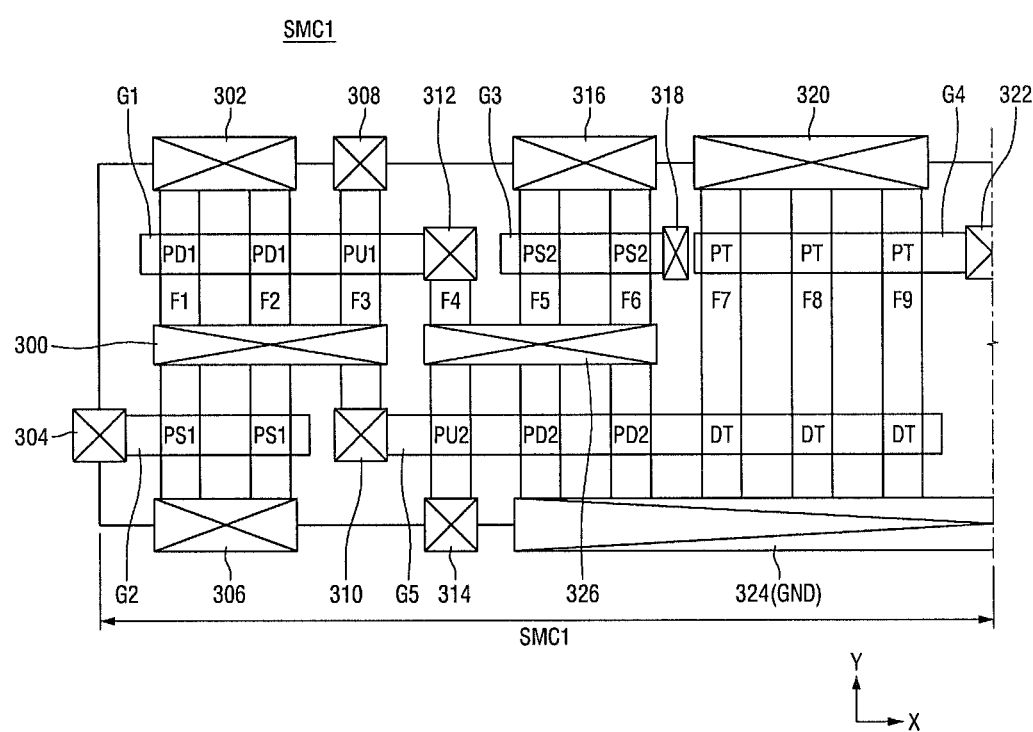
FIG. 13 is a layout diagram of the first SRAM cell region illustrated in FIG. 11 according to an example embodiment of the present inventive concepts.

Referring additionally to FIG. 13, each SRAM cell region, for example, the first SRAM cell region SMC1, may include nine active fins F1 through F9, five gate electrodes G1 through G5, and a plurality of contacts 300, 302, 304, 306, 308, 310, 312, 314, 316, 318, 320, 322, 324 and 326.

First through ninth active fins F1 through F9 may extend in a first direction Y.

A first gate electrode G1 may overlap the first through third active fins F1 through F3 and extend in a second direction X. The first pull-down transistor PD1 may be formed at each of the intersections of the first and second active fins F1 and F2 and the first gate electrode G1. The first pull-up transistor PU1 may be formed at the intersection of the third active fin F3 and the first gate electrode G1.

A source of the first pull-down transistor PD1 may be connected to a second contact 302. The second contact 302 may be connected to the ground node VSS. A source of the first pull-up transistor PU1 may be connected to a fifth contact 308. The fifth contact 308 may be connected to the power source node VDD. A drain of the first pull-down transistor PD1 and a drain of the first pull-up transistor PU1 may be connected to a first contact 300. That is, the first pull-down transistor PD1 and the first pull-up transistor PU1 may share the first contact 300.

The first select transistor PS1 may be formed at each of the intersections of the first and second active fins F1 and F2 and a second gate electrode G2. The second gate electrode G2 may overlap the first and second active fins F1 and F2 and extend in the second direction X. A drain of the first select transistor PS1 may be connected to the first contact 300. That is, the first pull-down transistor PD1, the first pull-up transistor PU1, and the first select transistor PS1 may share the first contact 300. A source of the first select transistor PS1 may be connected to a fourth contact 306. The fourth contact 306 may be connected to the bit line BL. The second gate electrode G2 may be connected to a third contact 304. The third contact 304 may be connected to the write word line WWL.

The first pull-down transistor PD1 and the first select transistor PS1 may be formed using two active fins F1 and F2, and the first pull-up transistor PU1 may be formed using one active fin F3. Therefore, the first pull-down transistor PD1 and the first select transistor PS1 may be larger than the first pull-up transistor PU1.

A sixth contact 310 may be connected to the first contact 300 by the third active fin F3. The sixth contact 310 may be connected to a fifth gate electrode G5. The fifth gate electrode G5 may extend in the second direction X to intersect the fourth through ninth active fins F4 through F9.

The second pull-up transistor PU2 may be formed at the intersection of the fourth active fin F4 and the fifth gate electrode G5. The second pull-down transistor PD2 may be formed at each of the intersections of the fifth and sixth active fins F5 and F6 and the fifth gate electrode G5. The drive transistor DT may be formed at each of the intersections of the seventh through ninth active fins F7 through F9 and the fifth gate electrode G5.

Since the first contact 300 is connected to the fifth gate electrode G5 by the third active fin F3 and the sixth contact 310, outputs of the first pull-up transistor PU1, the first pull-down transistor PD1, and the first select transistor PS1 may be transmitted to gates of the second pull-up transistor PU2, the second pull-down transistor PD2, and the drive transistor DT.

A drain of the second pull-up transistor PU2 and a drain of the second pull-down transistor PD2 may be connected to a fourteenth contact 326 and a seventh contact 312 by the active fin F4. The seventh contact 312 may be connected to the first gate electrode G1. Therefore, an output of the second pull-up transistor PU2 and an output of the second pull-down transistor PD2 may be transmitted to gates of the first pull-up transistor PU1 and the first pull-down transistor PD1.

A source of the second pull-up transistor PU2 may be connected to an eighth contact 314. The eighth contact 314 may be connected to the power source node VDD. A source of the second pull-down transistor PD2 and a source of the drive transistor DT may be connected to a thirteenth contact 324. The thirteenth contact 324 may be connected to the ground node VSS.

The second select transistor PS2 may be formed at each of the intersection of the fifth and sixth active fins F5 and F6 and a third gate electrode G3. The third gate electrode G3 may extend in the second direction X to intersect the fifth and sixth active fins F5 and F6. The pass transistor PT may be formed at each of the intersections of the seventh through ninth active fins F7 through F9 and a fourth gate electrode G4. The fourth gate electrode G4 may extend in the second direction X and intersect the seventh, eighth and ninth active fins F7, F8 and F9.

A source of the second select transistor PS2 may be connected to a ninth contact 316. The ninth contact 316 may be connected to the complementary bit line BLb. A drain of the second select transistor PS2 may be connected to the fourteenth contact 326. Since the fourteenth contact 326 is connected to the seventh contact 312 by the fourth active fin F4, an output of the second select transistor PS2 may be transmitted to the gates of the first pull-up transistor PU1 and the first pull-down transistor PD1. The third gate electrode G3 may be connected to a tenth contact 318. The tenth contact 318 may be connected to the write word line WWL. That is, the tenth contact 318 and the fourth contact 306 may be electrically connected to each other.

A source of the pass transistor PT may be connected to an eleventh contact 320. The eleventh contact 320 may be connected to the read bit line RBL. A drain of the pass transistor PT may be connected to a drain of the drive transistor DT.

The fourth gate electrode G4 may be connected to the twelfth contact 322. The twelfth contact 322 may be connected to the read word line RWL. In the example embodiment of FIGS. 11 through 13, the first SRAM cell region SMC1 and the second SRAM cell region SMC2 may share the twelfth contact 322 and the thirteenth contact 324. However, the present inventive concepts are not limited thereto, and various modifications may be made. For example, in some embodiments of the present inventive concepts, the first SRAM cell region SMC1 and the second SRAM cell region SMC2 may not share a contact and may be respectively connected to the write word line RWL and the ground node VSS by separate contacts.

The drive transistor DT and the pass transistor PT may be formed using three active fins F7 through F9. The second pull-down transistor PD2 and the second select transistor PS2 may be formed using two active fins F5 and F6. The second pull-up transistor PU2 may be formed using one active fin F4. Therefore, the drive transistor DT and the pass transistor PT may be larger than the second pull-down transistor PD2 and the second select transistor PS2, and the second pull-down transistor PD2 and the second select transistor PS2 may be larger than the second pull-up transistor PU2. That is, in the example embodiment of FIGS. 11 through 13, transistors disposed at a boundary between the first SRAM cell region SMC1 and the second SRAM cell region SMC2 may be larger than transistors far away from the boundary between the first SRAM cell region SMC1 and the second SRAM cell region SMC2.

At least one of the transistors PU1 and PU2, PD1 and PD2, PS1 and PS2, PT and DT included in the semiconductor device 6 may employ the structures according to the above-described example embodiments.

Semiconductor devices 13 and 14 according to example embodiments of the present inventive concepts will now be described with reference to FIGS. 14 and 15, respectively.

Figure 14:
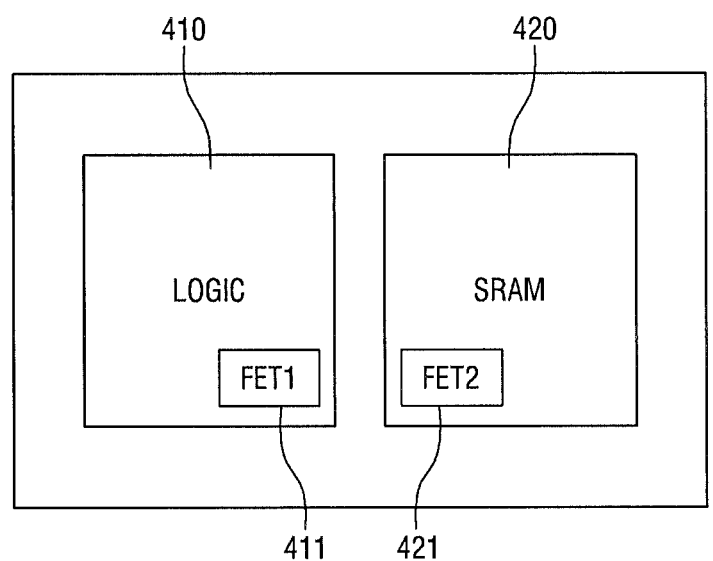
FIG. 14 is a diagram of a semiconductor device according to an example embodiment of the present inventive concepts.

FIG. 14 is a diagram of the semiconductor device 13 according to an example embodiment of the present inventive concepts. FIG. 15 is a diagram of the semiconductor device 14 according to an example embodiment of the present inventive concepts. For simplicity, the example embodiments of FIGS. 14 and 15 will hereinafter be described, focusing mainly on differences from the previous example embodiments.

Referring to FIG. 14, the semiconductor device 13 according to the example embodiment of the present inventive concepts may include a logic region 410 and an SRAM region 420. A first transistor 411 may be disposed in the logic region 410, and a second transistor 421 may be disposed in the SRAM region 420.

Figure 15:
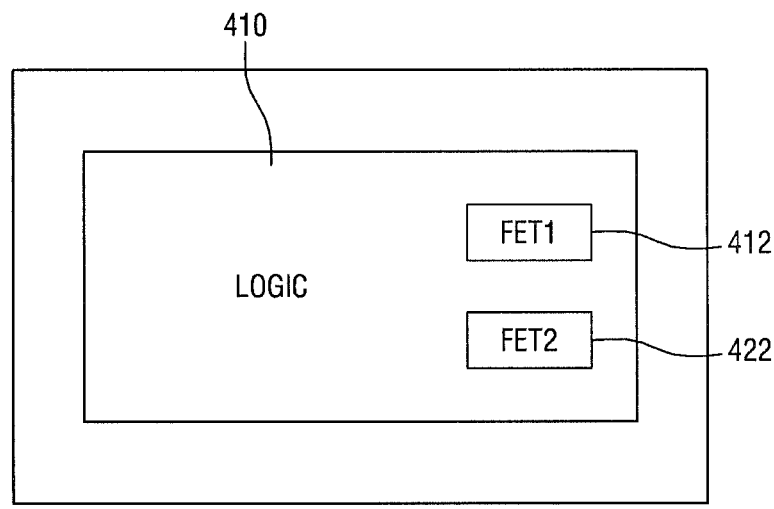
FIG. 15 is a diagram of a semiconductor device according to an example embodiment of the present inventive concepts.

Referring to FIG. 15, the semiconductor device 14 according to the example embodiment of the present inventive concepts may include a logic region 410. In the logic region 410, third and fourth transistors 412 and 422 which are different from each other may be disposed. Although not specifically illustrated, the third and fourth transistors 412 and 422 which are different from each other may also be disposed in an SRAM region.

The first transistor 411 may be any one of the semiconductor devices 1 through 4 of FIGS. 1A through 8, respectively, according to the above-described example embodiments of the present inventive concepts, and the second transistor 421 may be any one of the semiconductor devices 5 and 6 of FIGS. 9 through 13, respectively, according to the above-described example embodiments of the present inventive concepts. For example, the first transistor 411 may be the semiconductor device 1 of FIG. 1A, and the second transistor 421 may be the semiconductor device 5 of FIGS. 9 and 10.

The third transistor 412 may be any one of the semiconductor devices 1 through 4 of FIGS. 1A through 8, respectively, according to the above-described example embodiments of the present inventive concepts, and the fourth transistor 422 may be another one of the semiconductor devices 1 through 4 of FIGS. 1A through 8, respectively, according to the above-described example embodiments of the present inventive concepts.

In FIG. 14, the logic region 410 and the SRAM region 420 are illustrated as an example, but the present inventive concepts are not limited to this example. The present inventive concepts are also applicable to the logic region 410 and a region where a different memory, for example, DRAM, MRAM, RRAM, PRAM, or the like, is formed.

Figure 16:
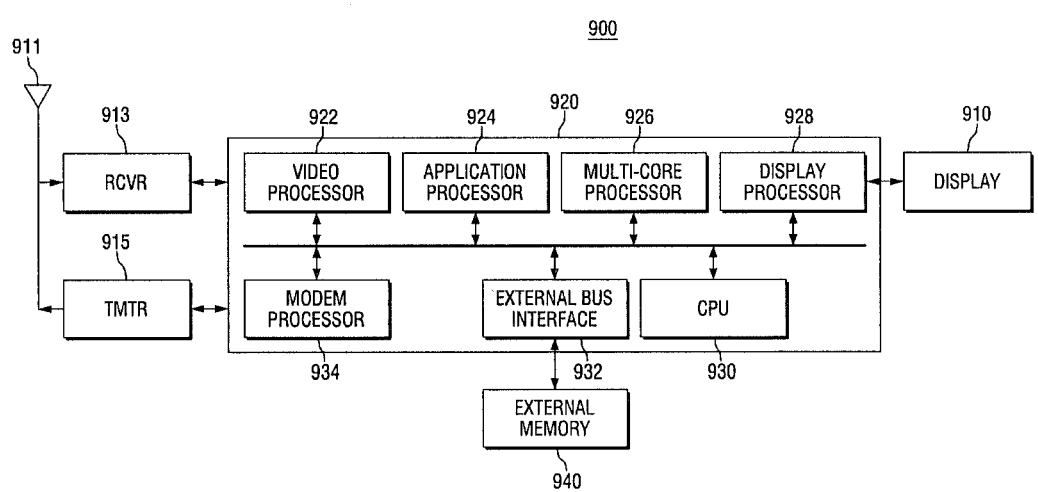
FIG. 16 is a block diagram of a wireless communication device including semiconductor devices according to the example embodiments of the present inventive concepts.

FIG. 16 is a block diagram of a wireless communication device 900 including semiconductor devices according to the example embodiments of the present inventive concepts.

Referring to FIG. 16, the wireless communication device 900 may be a cellular phone, a smartphone terminal, a handset, a personal digital assistant (PDA), a laptop computer, a video game unit, or some other device. The device 900 may use Code Division Multiple Access (CDMA), Time Division Multiple Access (TDMA), such as Global System for Mobile communications (GSM), or some other wireless communication standard.

The device 900 may provide bidirectional communication via a receive path and a transmit path. On the receive path, signals transmitted by one or more base stations may be received by an antenna 911 and provided to a receiver (RCVR) 913. The RCVR 913 conditions and digitizes the received signal and provides samples to a digital section 920 for further processing. On the transmit path, a transmitter (TMTR) 915 receives data transmitted from the digital section 920, processes and conditions the data, generates a modulated signal, and transmits the modulated signal to one or more base stations via the antenna 911.

The digital section 920 may be implemented with one or more digital signal processors (DSPs), microprocessors, reduced instruction set computers (RISCs), or the like. In addition, the digital section 920 may be fabricated on one or more application specific integrated circuits (ASICs) or some other type of integrated circuits (ICs).

The digital section 920 may include various processing and interface units such as, for example, a modem processor 934, a video processor 922, an application processor 924, a display processor 928, a controller/multi-core processor 926, a central processing unit (CPU) 930, and an external bus interface (EBI) 932. The external bus interface (EBI) 932 is connected to external memory 940.

The video processor 922 may perform processing for graphics applications. Generally, the video processor 922 may include any number of processing units or modules for any set of graphics operations. Certain portions of the video processor 922 may be implemented in firmware and/or software. For example, a control unit may be implemented with firmware and/or software modules, for example, procedures, functions, or the like, that perform functions described herein. The firmware and/or software codes may be stored in a memory and executed by a processor, for example, the multi-core processor 926. The memory may be implemented inside or outside the processor.

The video processor 922 may implement a software interface such as Open Graphics Library (OpenGL), Direct3D, or the like. The CPU 930 may execute a series of graphics processing operations, together with the video processor 922. The controller/multi-core processor 926 may include two or more cores. The controller/multi-core processor 926 may allocate a workload to be processed to two cores according to the workload and process the workload simultaneously.

As illustrated in FIG. 16, the application processor 924 is an element of the digital section 920. However, the present inventive concepts are not limited thereto. In some embodiments of the present inventive concepts, the digital section 920 may be integrated into one application processor 924 or one application chip.

The modem processor 934 may perform operations needed to deliver data between each of the RCVR 913 and the TMTR 915 and the digital section 920. The display processor 928 may perform operations needed to drive a display 910.

The semiconductor devices 1 through 6, 13 and 14 of FIGS. 1A through 15, respectively, according to the above-described example embodiments of the present inventive concepts may be used as a cache memory or a buffer memory utilized for the operations of the video processor 922, the application processor 924, the multi-core processor 926, the display processor 928, the CPU 930 and the modem processor 934.

A computing system 1000 including semiconductor devices according to the example embodiments of the present inventive concepts will now be described with reference to FIG. 17.

Figure 17:
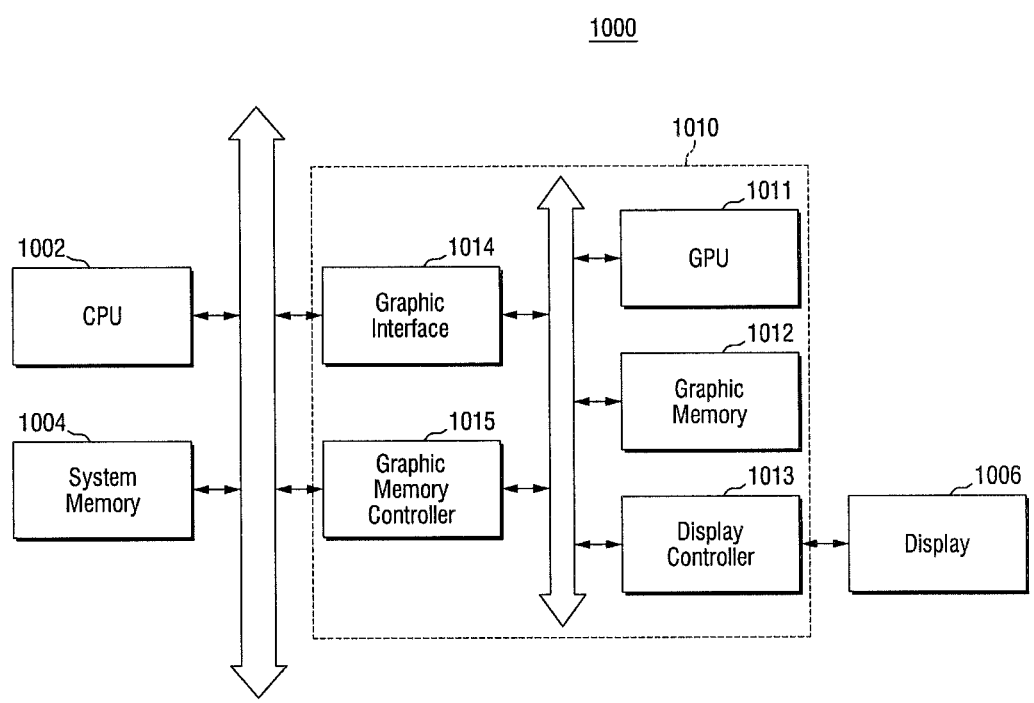
FIG. 17 is a block diagram of a computing system including semiconductor devices according to the example embodiments of the present inventive concepts.

FIG. 17 is a block diagram of the computing system 1000 including semiconductor devices according to the example embodiments of the present inventive concepts.

Referring to FIG. 17, the computing system 1000 according to the example embodiment of FIG. 17 includes a CPU 1002, a system memory 1004, a graphic system 1010, and a display 1006. The CPU 1002, the system memory 1004, and the graphic system 1010 may be coupled to a bus. The bus may serve as a path for transmitting data.

The CPU 1002 may perform operations needed to drive the computing system 1000. The system memory 1004 may be configured to store data. The system memory 1004 may store data processed by the CPU 1002. The system memory 1004 may serve as an operating memory of the CPU 1002. The system memory 1004 may include one or more volatile memories such as, for example, a double data rate static dynamic random access memory (DDR SDRAM) and a single data rate static dynamic random access memory (SDR SDRAM) and/or one or more nonvolatile memories such as an electrical erasable programmable read only memory (EEPROM) and a flash memory. Any one of the semiconductor devices 1 through 6, 13 and 14 of FIGS. 1A through 15, respectively, according to the above-described example embodiments may be employed as an element of the system memory 1004.

The graphic system 1010 may include a graphic processing unit (GPU) 1011, a graphic memory 1012, a display controller 1013, a graphic interface 1014, and a graph memory controller 1015. The GPU 1011, the graphic memory 1012, the display controller 1013, the graphic interface 1014, and the graph memory controller 1015 may be coupled to a bus. The bus may serve as a path for transmitting data.

The GPU 1011 may perform graphics operations needed for the computing system 1000. Specifically, the GPU 1011 may assemble primitives, each composed of one or more vertices, and render the assembled primitives.

The graphic memory 1012 may store graphic data processed by the GPU 1011 or store graphic data that is to be provided to the GPU 1011. Alternatively, the graphic memory 1012 may serve as an operating memory of the GPU 1011. Any one of the semiconductor devices 1 through 6, 13 and 14 of FIGS. 1A through 15, respectively, according to the above-described example embodiments of the present inventive concepts may be employed as an element of the graphic memory 1012.

The display controller 1013 may control the display 1006 to display a rendered image frame.

The graphic interface 1014 may interface between the CPU 1002 and the GPU 1011, and the graphic memory controller 1015 may provide memory access between the system memory 1004 and the GPU 1011.

The computing system 1000 may further include one or more input devices such as, for example, buttons, a touch-screen, a microphone or the like and/or one or more output devices such as, for example, a speaker or the like. In addition, the computing system 1000 may further include an interface device for data exchange with an external device in a wired or wireless manner. The interface device may include, for example, an antenna or a wired or wireless transceiver.

Depending on the embodiment, the computing system 1000 may be any computing system such as a mobile phone, a smartphone, a PDA, a desktop, a notebook computer, a tablet, or the like.

An electronic system 1100 including semiconductor devices according to the example embodiments of the present inventive concepts will now be described with reference to FIG. 18.

Figure 18:
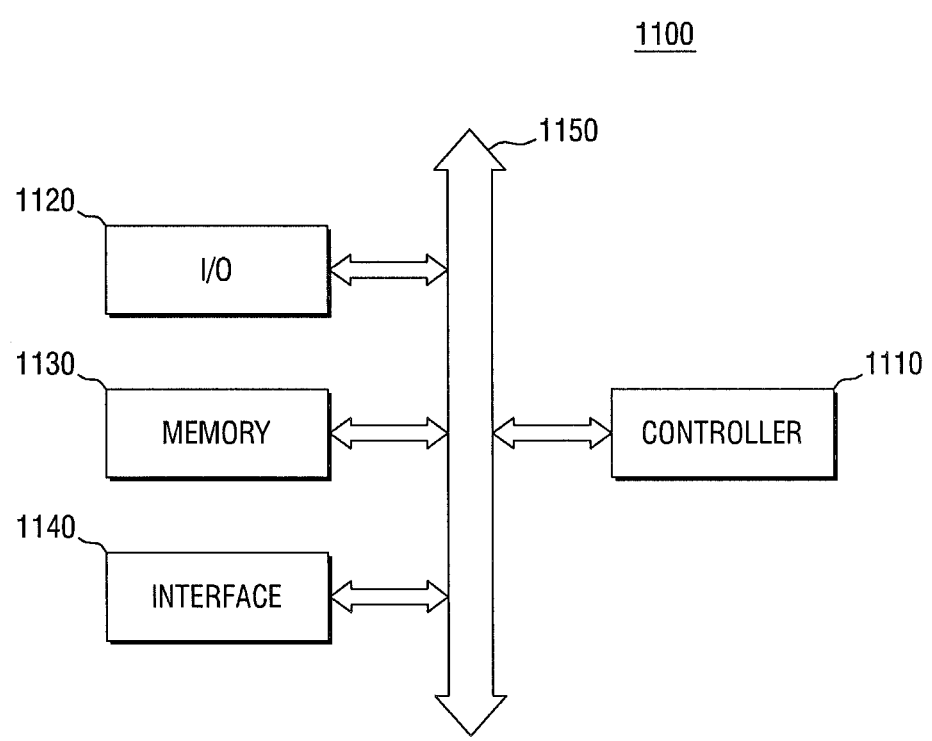
FIG. 18 is a block diagram of an electronic system including semiconductor devices according to the example embodiments of the present inventive concepts.

FIG. 18 is a block diagram of the electronic system 1100 including semiconductor devices according to the example embodiments of the present inventive concepts.

Referring to FIG. 18, the electronic system 1100 according to an example embodiment of the present inventive concepts may include a controller 1110, an input/output (I/O) device 1120, a memory device 1130, an interface 1140 and a bus 1150. The controller 1110, the I/O device 1120, the memory device 1130 and/or the interface 1140 may be connected to one another by the bus 1150. The bus 1150 may serve as a path for transmitting data.

The controller 1110 may include, for example, at least one of a microprocessor, a digital signal processor, a microcontroller and logic devices capable of performing similar functions to those of a microprocessor, a digital signal processor and a microcontroller. The I/O device 1120 may include, for example, a keypad, a keyboard and a display device. The memory device 1130 may store data and/or commands. The interface 1140 may be used to transmit data to or receive data from a communication network. The interface 1140 may be a wired or wireless interface. In some embodiments, the interface 1140 may include an antenna or a wired or wireless transceiver.

The electronic system 1100 may be an operating memory for improving the operation of the controller 1110, and may also include a high-speed DRAM or SRAM. Any one of the semiconductor devices 1 through 6, 13 and 14 of FIGS. 1A through 15, respectively, according to the above-described example embodiments of the present inventive concepts may be employed as the operating memory. In addition, any one of the semiconductor devices 1 through 6, 13 and 14 of FIGS. 1A through 15, respectively, according to the above-described example embodiments may be provided in the memory device 1130 or in the controller 1110 or the I/O device 1120.

The electronic system 1100 may be applied to nearly all types of electronic products capable of transmitting and/or receiving information in a wireless environment, such as a PDA, a portable computer, a web tablet, a wireless phone, a mobile phone, a digital music player, a memory card, or the like.

Figure 19:
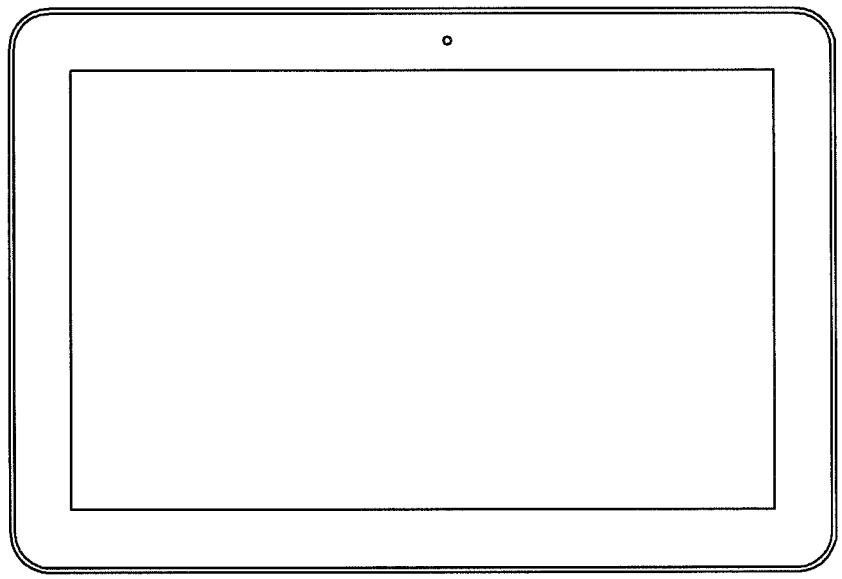
FIGS. 19 through 21 are diagrams illustrating examples of a semiconductor system to which semiconductor devices according to the example embodiments of the present inventive concepts may be applied.
Figure 20:
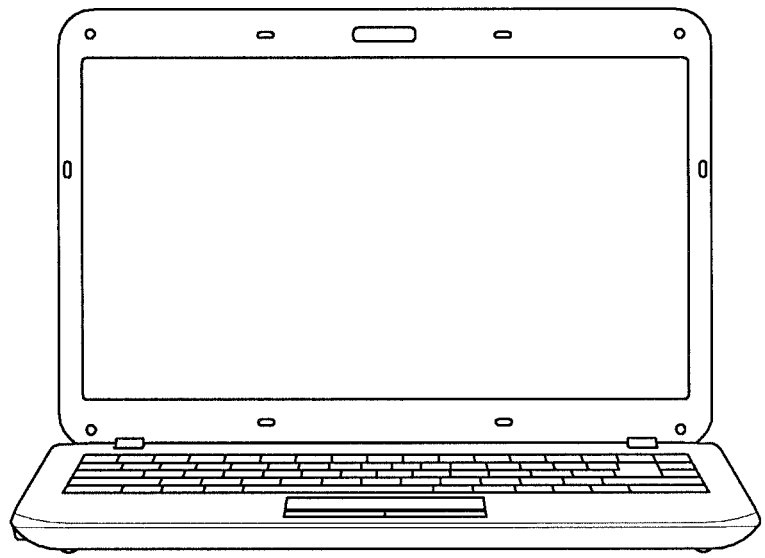
Figure 21:
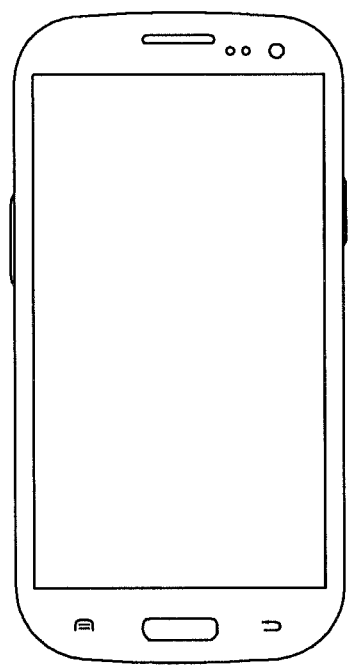

FIGS. 19 through 21 are diagrams illustrating examples of a semiconductor system to which semiconductor devices according to the embodiments of the present inventive concepts may be applied.

FIG. 19 illustrates a tablet personal computer (PC) 1200, FIG. 20 illustrates a notebook computer 1300, and FIG. 21 illustrates a smartphone 1400. At least one of the semiconductor devices 1 through 6, 13 and 14 of FIGS. 1A through 15, respectively, according to the above-described example embodiments of the present inventive concepts, as set forth herein, may be used in the tablet PC 1200, the notebook computer 1300, and/or the smartphone 1400.

The semiconductor devices 1 through 6, 13 and 14 of FIGS. 1A through 15, respectively, according to the example embodiments of the present inventive concepts, as set forth herein, may also be applied to various IC devices other than those set forth herein. That is, while the tablet PC 120, the notebook computer 1300, and the smartphone 1400 have been described above as examples of a semiconductor system according to an example embodiment of the present inventive concepts, the examples of the semiconductor system according to the embodiment are not limited to the tablet PC 1200, the notebook computer 1300, and the smartphone 1400. In some embodiments of the present inventive concepts, the semiconductor system may be provided as a computer, an Ultra Mobile PC (UMPC), a work station, a net-book computer, a PDA, a portable computer, a wireless phone, a mobile phone, an e-book, a portable multimedia player (PMP), a portable game console, a navigation device, a black box, a digital camera, a 3-dimensional television set, a digital audio recorder, a digital audio player, a digital picture recorder, a digital picture player, a digital video recorder, a digital video player, or the like.

Methods of fabricating semiconductor devices according to example embodiments of the present inventive concepts will now be described with reference to FIGS. 22 through 30.

Figure 23:
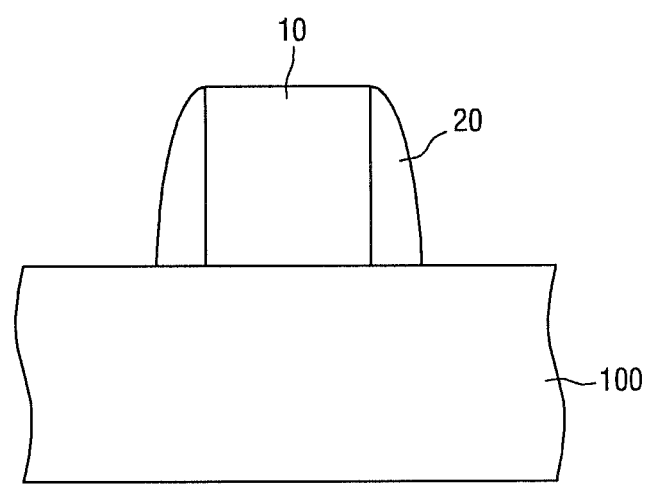
Figure 24:
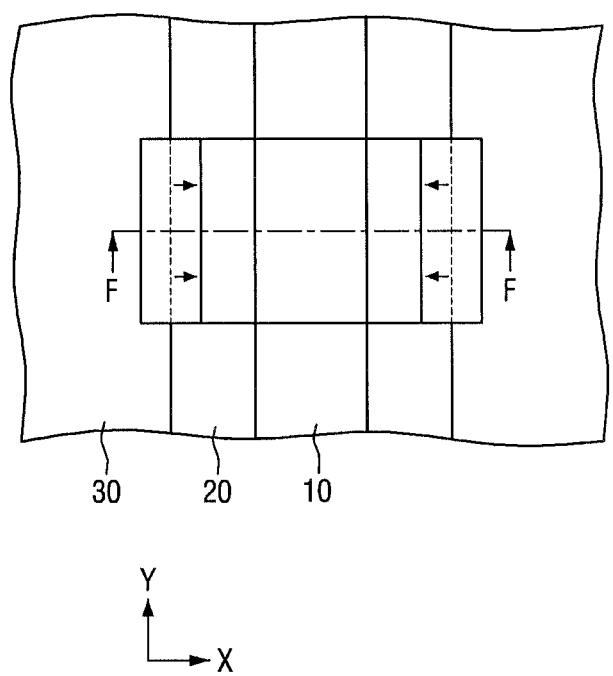
Figure 25:
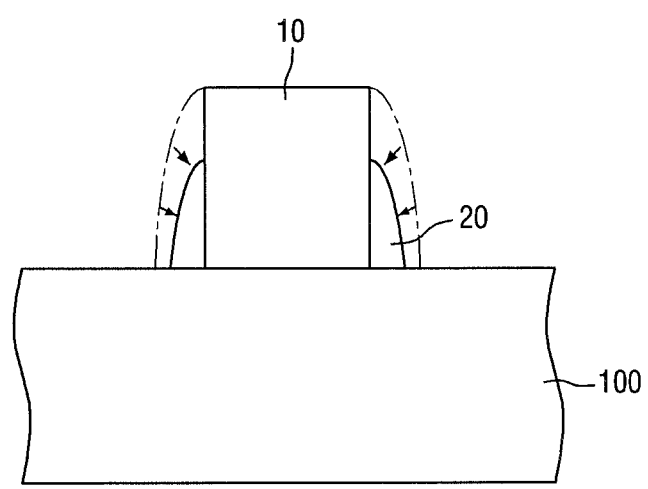

FIGS. 22 through 30 illustrate steps of methods of fabricating semiconductor devices according to example embodiments of the present inventive concepts. FIG. 23 is a cross-sectional view taken along line E-E of FIG. 22 according to an example embodiment of the present inventive concepts. FIG. 25 is a cross-sectional view taken along line F-F of FIG. 24 according to an example embodiment of the present inventive concepts.

First, a method of fabricating the semiconductor device 1 of FIG. 1A according to the example embodiment of the present inventive concepts will be described with reference to FIGS. 22 through 27.

Referring to FIGS. 22 and 23, a first insulating layer (not shown) is formed on an active layer 100 by using a process such as chemical vapor deposition (CVD), plasma-enhanced chemical vapor deposition (PECVD), or the like. Then, the first insulating layer (not shown) is patterned to form a dummy structure 10 which extends in a first direction Y.

The dummy structure 10 may be referred to as a mandrel. The dummy structure 10 may be, for example, an oxide layer, a nitride layer, an oxynitride layer, or a combination of these layers. In addition, the dummy structure 10 may be formed, for example, of an organic material such as SOH, photoresist, or the like.

A second insulating layer (not shown) is formed on the dummy structure 10 to cover the dummy structure 10. Then, the second insulating layer (not shown) is patterned to form dummy spacers 20, which extend in the first direction Y, on both sides of the dummy structure 10. The dummy spacers 20 may be formed by, for example, anisotropic etching.

The dummy spacers 20 may be formed of, for example, an oxynitride layer.

Referring to FIGS. 24 and 25, a first mask 30 is formed on the dummy structure 10 and the dummy spacers 20 to expose a region of each of the dummy spacers 20. A region of the dummy structure 10 may also be exposed.

Next, a side of each of the exposed dummy spacers 20 is etched. Accordingly, a width of each of the exposed dummy spacers 20 in a second direction X is reduced. In the process of etching the dummy spacers 20, a height of each of the dummy spacers 20 may also be reduced as shown in FIG. 25.

Figure 26:
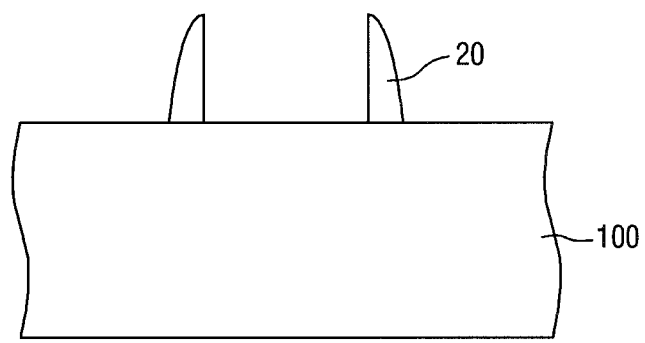
Figure 27:
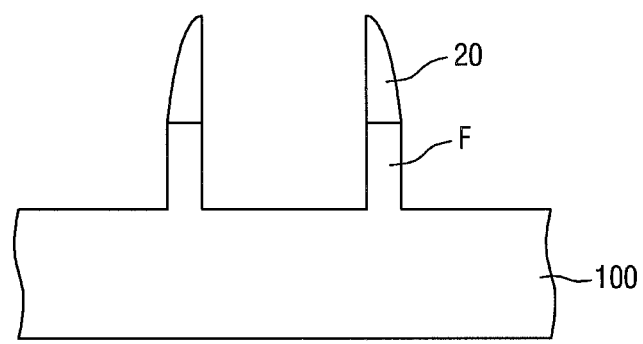

Referring to FIG. 26, a top surface of the active layer 100 is exposed by removing the dummy structure 10. Referring to FIG. 27, active fins F are formed by etching the exposed active layer 100 using the dummy spacers 20 as a mask. The active layer 100 may be etched using, for example, anisotropic etching such as, for example, reactive-ion etching (RIE).

Through the above process, the active fins F are formed in the same shape as the dummy spacers 20. In the process described above with reference to FIGS. 24 and 25, the width of a region of each of the dummy spacers 20 in the second direction X becomes smaller than that of the other region thereof. Therefore, the final shapes of the active fins F will be the same as those of the first and second active fins F1 and F2 shown in FIG. 1A. Subsequently, other elements described above with reference to FIGS. 1A through 4 are formed, thereby completing the semiconductor device 1 according to the example embodiment of the present inventive concepts.

If a semiconductor device is fabricated as described above, a plurality of transistors having various characteristics may be formed relatively easily, for example, by adjusting the width of each of the active fins F.

A method of fabricating the semiconductor device 2 of FIG. 5 according to the example embodiment of the present inventive concepts will now be described with reference to FIGS. 28A through 28D.

Figure 28A:
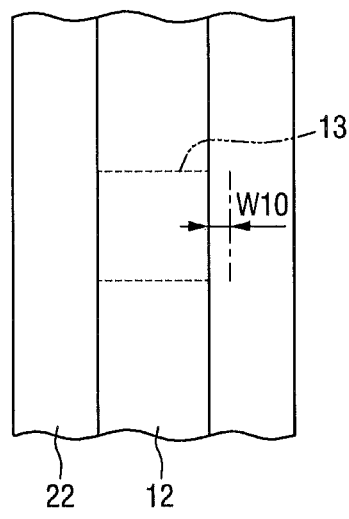
FIGS. 28A through 28D are views illustrating steps of methods of fabricating semiconductor devices according to example embodiments of the present inventive concepts.

Referring to FIG. 28A, at a first layout design step, a marker 13 is set in a region of a dummy structure 12. Then, an offset W10 is determined for the region with the marker 13.

Figure 28B:
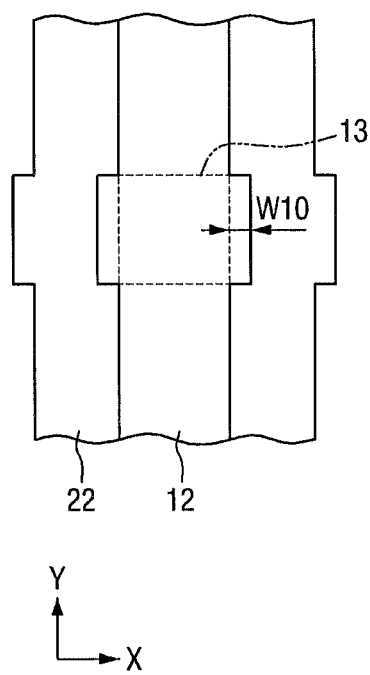

Referring to FIG. 28B, at a second layout design step following the first layout design step, a width of the region with the marker 13 is increased by the offset W10. Then, dummy spacers 22 are placed on both sides of the dummy structure 12.

The dummy structure 12 and the dummy spacers 22 formed using the above layout design may be shaped as shown in FIG. 28B.

Figure 28C:
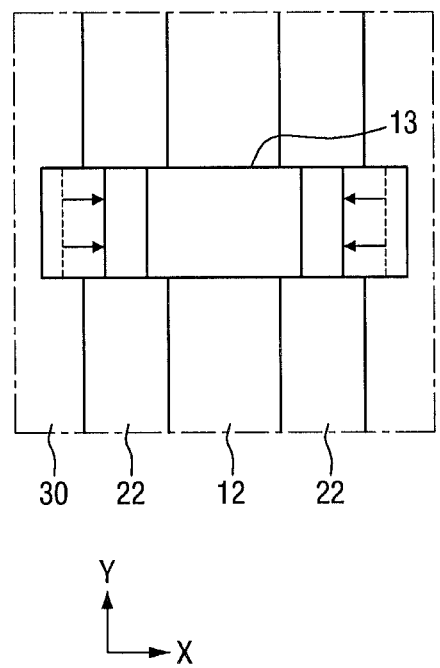
Figure 28D:
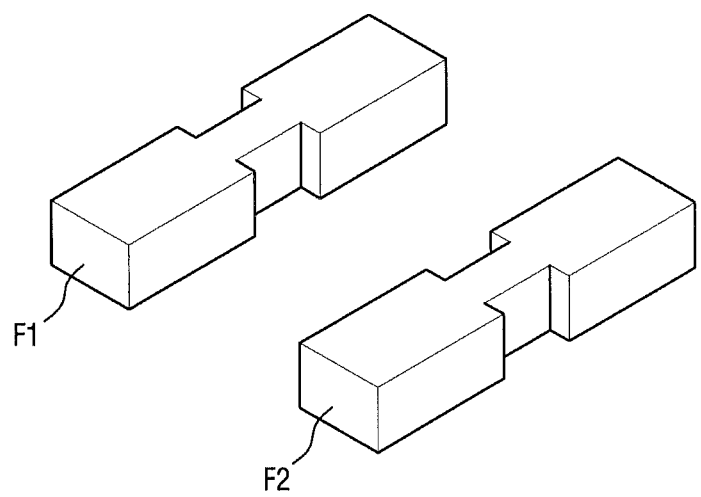

Referring to FIG. 28C, a first mask 30 is formed on the dummy structure 12 and the dummy spacers 22 to expose a region of each of the dummy spacers 22. Then, a side of each of the exposed dummy spacers 22 is etched to produce dumbbell-shaped dummy spacers 22. First and second active fins F1 and F2 fabricated using these dummy spacers 22 according to the above-described method may be shaped as shown in FIG. 28D.

Subsequently, other elements described above with reference to FIGS. 1A through 4 are formed, thereby completing the semiconductor device 2 of FIG. 5 according to the example embodiment of the present inventive concepts.

A method of fabricating the semiconductor device 3 of FIG. 6 according to the example embodiment of the present inventive concepts will now be described with reference to FIGS. 22 and 29A through 30.

Referring to FIG. 22, a dummy structure 10 and dummy spacers 20 are formed to extend in a first direction Y.

Figure 29A:
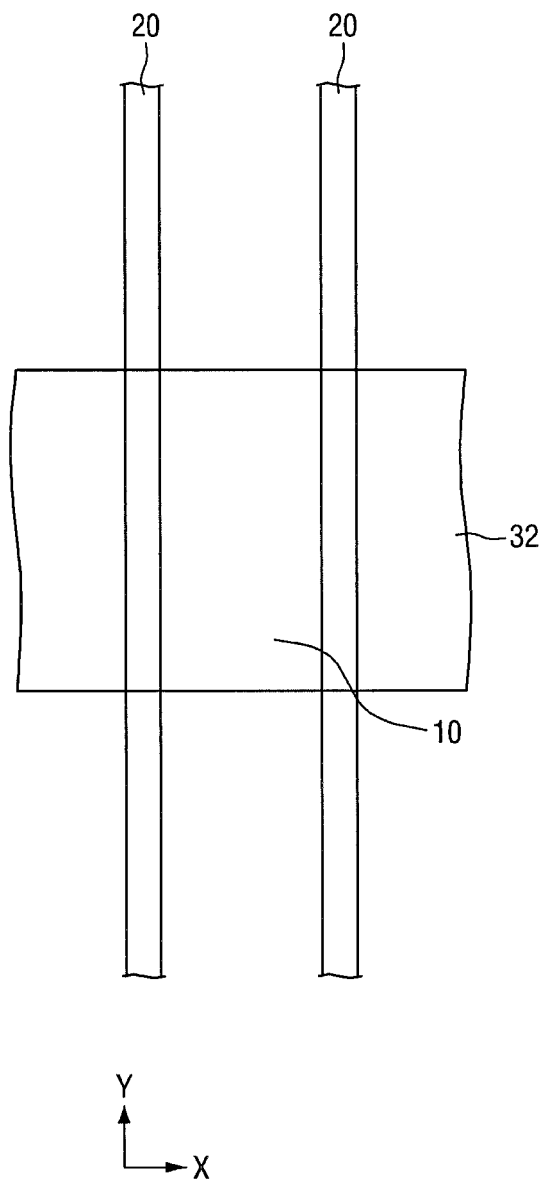
FIGS. 29A through 29B are views illustrating steps of methods of fabricating semiconductor devices according to example embodiments of the present inventive concepts.

Referring to FIG. 29A, a second mask 32 is formed to partially cover the dummy structure 10 and the dummy spacers 20. Then, regions of the dummy structure 10 which are exposed by the second mask 32 are removed.

Figure 29B:
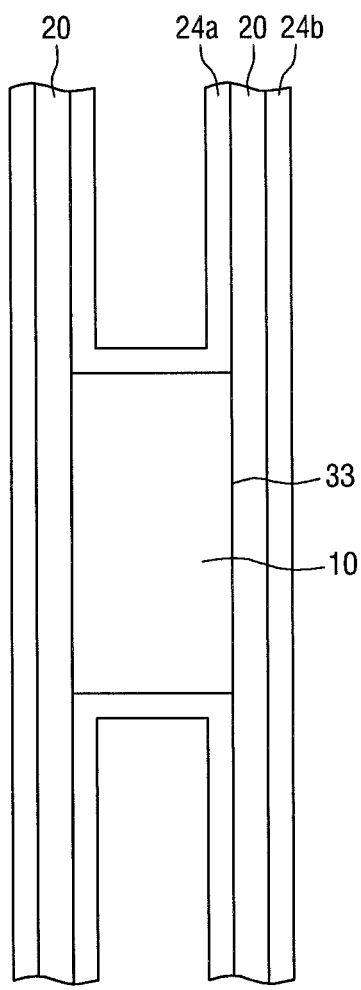

Referring to FIG. 29B, the second mask 32, as illustrated in FIG. 29A is removed. Then, a third mask 33 is formed. An insulating layer including the same material as the dummy spacers 20 is deposited. Accordingly, a first sub-dummy spacer 24a is formed in a region where a side of each of the dummy spacers 20 is adjacent to the third mask 33, and a second sub-dummy spacer 24b is formed on the other side of each of the dummy spacers 20.

Figure 30:
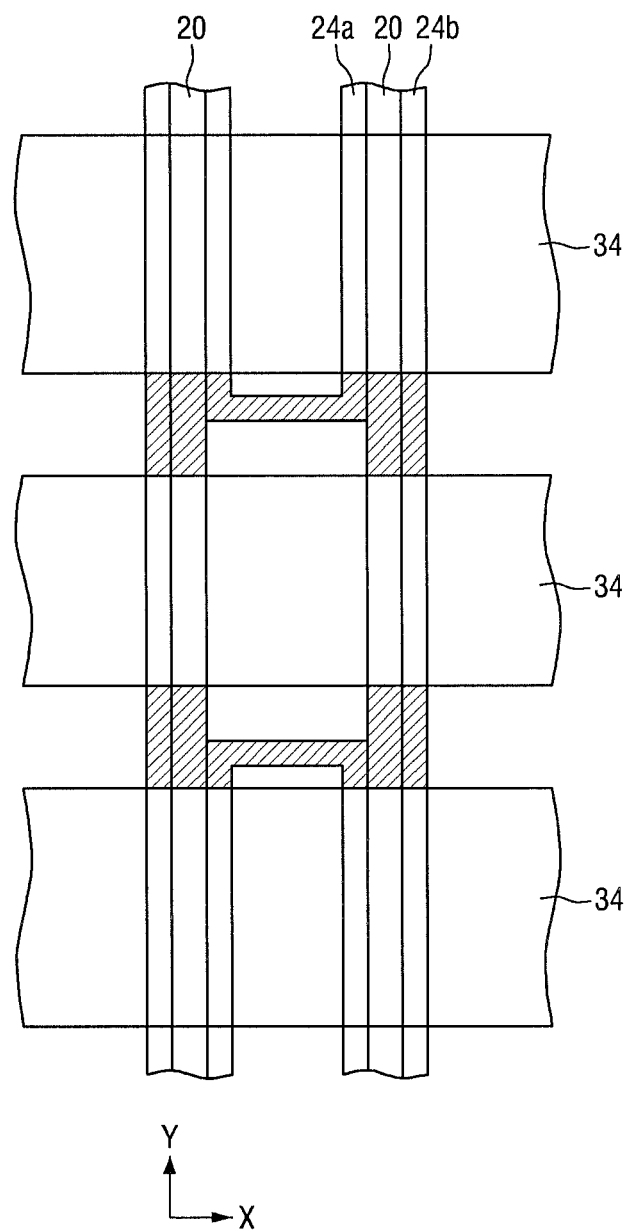
FIGS. 30 through 32 are views illustrating steps of methods of fabricating semiconductor devices according to example embodiments of the present inventive concepts.

Referring to FIG. 30, the third mask 33 of FIG. 29B is removed, and then, the remaining dummy structure 10 of FIG. 29A is removed.

Next, fourth masks 34 are formed. The fourth masks 34 may expose regions of the dummy spacers 20 (hatched regions of the dummy spacers 20), regions of the first sub-dummy spacers 24a (hatched regions of the first sub-dummy spacers 24a), and regions of the second sub-dummy spacers 24b (hatched regions of the second sub-dummy spacers 24b). The exposed regions of the dummy spacers 20, the exposed regions of the first sub-dummy spacers 24a, and the exposed regions of the second sub dummy spacers 24b are etched.

Through the above process, the dummy spacers 20 and the first and second sub-dummy spacers 24a and 24b may be separated in the first direction Y. As a result, while all of the first and second sub dummy spacers 24a and 24b and the dummy spacers 20 exist in upper and lower regions of FIG. 30, only the dummy spacers 20 may exist in a middle region of FIG. 30. Therefore, the eleventh through thirteenth active fins F11 through F13 and the twenty first through twenty third active fins F21 through F23 shown in FIG. 6 can be formed.

A method of fabricating the semiconductor device 4 of FIG. 8 according to the example embodiment of the present inventive concepts will now be described with reference to FIGS. 22, 31 and 32.

Referring to FIG. 22, a dummy structure 10 and dummy spacers 20 are formed to extend in a first direction Y.

Figure 31:
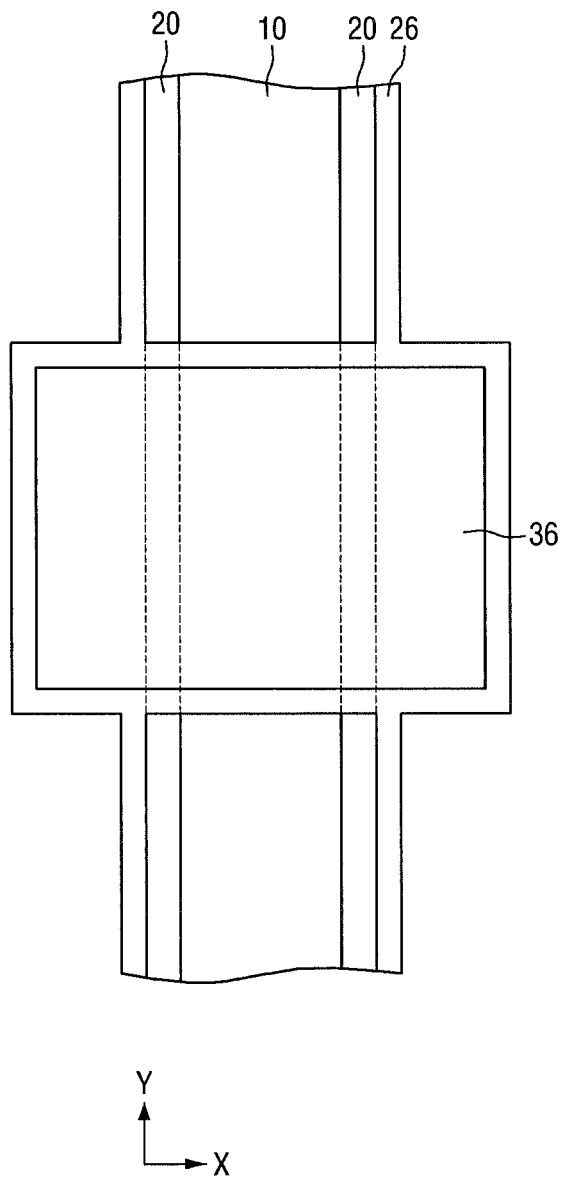

Referring to FIG. 31, a fifth mask 36 is formed to partially cover the dummy structure 10 and the dummy spacers 20. Then, a third sub-dummy spacer 26 is formed. Here, the third sub-dummy spacer 26 may be formed along outer surfaces of the dummy spacers 20 and outer surfaces of the fifth mask 36.

Figure 32:
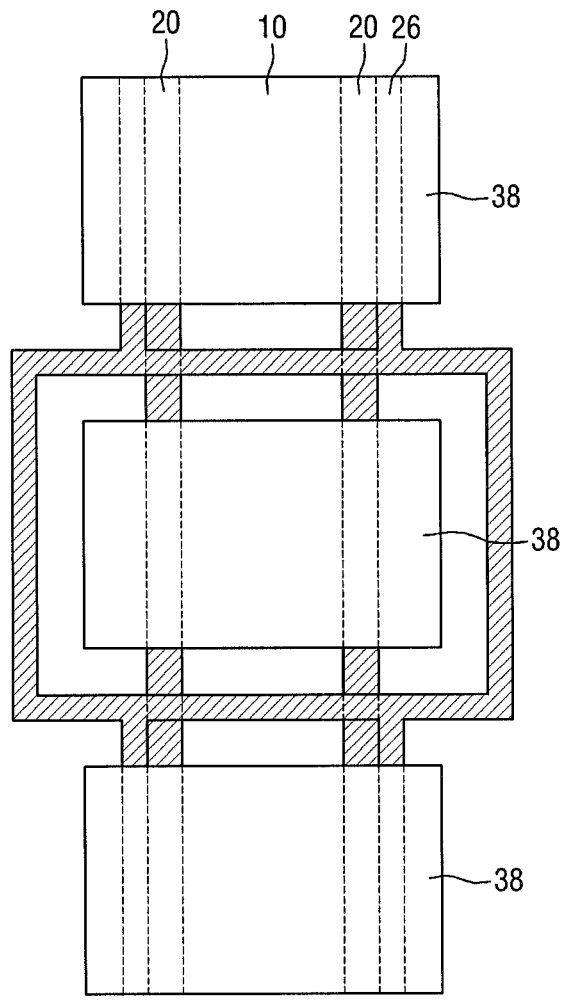

Referring to FIG. 32, fifth masks 38 are formed to extend in a second direction X and expose a portion of the dummy structure 10, a portion of the dummy spacers 20 (hatched region of the dummy spacers 20), and a portion of the third sub-dummy spacer 26 (hatched region of the third sub-dummy spacer 26). The exposed regions of the dummy structure 10, the exposed regions of the dummy spacers 20, and the exposed regions of the third sub-dummy spacer 26 are etched.

If the remaining dummy structure 10 is removed, the eleventh through thirteenth active fins F11 through F13 and the twenty first through twenty third active fins F21 through F23 illustrated in FIG. 8 may be formed.

While the present inventive concepts have been particularly shown and described with reference to example embodiments thereof, it will be understood by those of ordinary skill in the art that various changes in form and detail may be made therein without departing from the spirit and scope of the present inventive concepts as defined by the following claims. The example embodiments should be considered in a descriptive sense only and not for purposes of limitation.

What is claimed is:

1. A semiconductor device comprising:
   active fins protruding from an active layer and extending in a first direction;
   a gate structure on the active fins extending in a second direction intersecting the first direction; and
   a spacer on at least one side of the gate structure,
   wherein each of the active fins comprises a first region and a second region adjacent to the first region in the first direction, and a width of the first region in the second direction is different from a width of the second region in the second direction; and
   wherein the first region is asymmetrical with respect to a centerline in the first direction of each of the active fins.

2. The semiconductor device of claim 1, wherein the first region is under the gate structure, and the second region is under the spacer.

3. The semiconductor device of claim 2, wherein part of the first region is under the spacer.

4. The semiconductor device of claim 2, wherein the width of the first region in the second direction is smaller than the width of the second region in the second direction.

5. The semiconductor device of claim 2, wherein the active fins comprise first through third active fins which are arranged sequentially in the second direction to be separated from each other, wherein a first gap between the first region of the first active fin and the first region of the second active fin is different from a second gap between the first region of the second active fin and the first region of the third active fin.

6. The semiconductor device of claim 2, wherein the active fins comprise first through third active fins which are arranged sequentially in the second direction to be separated from each other, wherein a first gap between the first region of the first active fin and the first region of the second active fin is equal to a second gap between the first region of the second active fin and the first region of the third active fin.

7. The semiconductor device of claim 1, wherein the active fins comprise a first active fin and a second active fin which are separated from each other in the first direction, wherein the first active fin is in the first region, and the second active fin is in the second region.

8. The semiconductor device of claim 7, further comprising a self-aligned contact which electrically connects the first active fin and the second active fin.

9. The semiconductor device of claim 7, wherein a width of the first active fin in the second direction is greater than a width of the second active fin in the second direction, and the first active fin comprises third through fifth active fins which are arranged sequentially in the second direction to be separated from each other, wherein a gap between the third active fin and the fourth active fin is equal to a gap between the fourth active fin and the fifth active fin.

10. The semiconductor device of claim 7, wherein a width of the first active fin in the second direction is greater than a width of the second active fin in the second direction, and the first active fin comprises third through fifth active fins which are arranged sequentially in the second direction to be separated from each other, wherein a gap between the third active fin and the fourth active fin is different from a gap between the fourth active fin and the fifth active fin.

11. The semiconductor device of claim 10, wherein a side of the first active fin is aligned with a side of the second active fin in the first direction.

12. A semiconductor device comprising:
a first transistor; and
a second transistor spaced apart from the first transistor in a first direction,
wherein the first transistor comprises a first active fin which extends in the first direction, and the second transistor comprises a second active fin which is aligned with the first active fin in the first direction, wherein a width of the first active fin in a second direction intersecting the first direction is different from a width of the second active fin in the second direction; and
wherein the first active fin is asymmetrical with respect to a centerline in the first direction through the second active fin.

13. The semiconductor device of claim 12, comprising a static random access memory (SRAM), wherein the first transistor comprises a pull-up transistor, and the second transistor comprises a pull-down transistor.

14. The semiconductor device of claim 12, wherein the width of the first active fin in the second direction is greater than the width of the second active fin in the second direction, and the first active fin comprises third through fifth active fins which are arranged sequentially in the second direction to be separated from each other, wherein a gap between the third active fin and the fourth active fin is equal to a gap between the fourth active fin and the fifth active fin.

15. The semiconductor device of claim 12, wherein a side of the first active fin is aligned with a side of the second active fin in the first direction.

16. A semiconductor device comprising:
a plurality of active fins extending in a first direction;
a gate structure extending in a second direction on a portion of each of the plurality of active fins; and
a spacer on at least one side of the gate structure,
wherein each of the plurality of active fins comprises a first region and a second region,
wherein the first region of each of the plurality of active fins comprises a first width in the second direction and the second region of each of the plurality of active fins comprises a second width in the second direction,
wherein the first width is smaller than the second width, and
wherein the first region is asymmetrical with respect to a centerline in the first direction of each of the active fins.

17. The semiconductor device of claim 16, wherein part of the first region is under the gate structure and part of the first region is under the spacer, and the second region is under the spacer.

18. The semiconductor device of claim 16, wherein the plurality of active fins comprise first through third active fins which are arranged sequentially in the second direction to be separated from each other, wherein a first gap between the first region of the first active fin and the first region of the second active fin is different from a second gap between the first region of the second active fin and the first region of the third active fin.

19. The semiconductor device of claim 16, wherein the plurality of active fins comprise first through third active fins which are arranged sequentially in the second direction to be separated from each other, wherein a first gap between the first region of the first active fin and the first region of the second active fin is equal to a second gap between the first region of the second active fin and the first region of the third active fin.

* * * * *